United States Patent
Song et al.

(10) Patent No.: US 7,998,825 B2
(45) Date of Patent: Aug. 16, 2011

(54) METHOD FOR FABRICATING SEMICONDUCTOR DEVICE

(75) Inventors: Han-Sang Song, Icheon-si (KR);
Jong-Bum Park, Icheon-si (KR);
Jong-Kook Park, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 19 days.

(21) Appl. No.: 12/344,154

(22) Filed: Dec. 24, 2008

(65) Prior Publication Data

US 2009/0291542 A1    Nov. 26, 2009

(30) Foreign Application Priority Data

May 21, 2008 (KR) .................. 10-2008-0046973

(51) Int. Cl.
*H01L 21/02* (2006.01)
(52) U.S. Cl. .................. 438/397; 257/E21.014
(58) Field of Classification Search .......... 438/396, 438/624, 640, 397; 257/E21.215, E21.014
See application file for complete search history.

(56) References Cited

U.S. PATENT DOCUMENTS

| 6,287,961 B1 * | 9/2001 | Liu et al. ................. 438/638 |
| 6,583,056 B2 * | 6/2003 | Yu et al. .................. 438/639 |
| 6,740,584 B2 * | 5/2004 | Eimori .................... 438/638 |
| 7,132,326 B2 * | 11/2006 | Lee et al. ................ 438/253 |

FOREIGN PATENT DOCUMENTS

| KR | 100388682 | 6/2003 |
| KR | 100434496 | 5/2004 |
| KR | 100534100 | 11/2005 |
| KR | 100672816 | 1/2007 |

OTHER PUBLICATIONS

Korean Notice of Allowance for Korean application No. 10-2008-0046973, Feb. 2010.
Chinese Office Action for application No. 200910007223.X, Aug. 2010.

* cited by examiner

*Primary Examiner* — Matthew Smith
*Assistant Examiner* — Daniel Shook
(74) *Attorney, Agent, or Firm* — Lowe Hauptman Ham & Berner LLP

(57) ABSTRACT

A method for fabricating a semiconductor device includes: forming an etch stop pattern over a conductive layer, the etch stop pattern having a first opening exposing a top surface of the conductive layer; forming an insulation layer over the etch stop pattern; selectively etching the insulation layer to form a second opening exposing the top surface of the conductive layer; and enlarging the second opening until the etch stop pattern is exposed.

22 Claims, 18 Drawing Sheets

METHOD FOR FABRICATING SEMICONDUCTOR DEVICE

CROSS-REFERENCE TO RELATED APPLICATIONS

The present application claims priority of Korean patent application number 10-2008-0046973, filed on May 21, 2008, which is incorporated by reference herein in its entirety.

BACKGROUND

The present embodiments relate to a method for fabricating a semiconductor device.

To form an open region such as a storage node hole and a contact hole in a semiconductor device, an insulation layer where the open region will be formed and an etch barrier pattern are formed in sequence. The insulation layer is then etched using the etch barrier pattern as an etch barrier to thereby form the open region. A conductive layer fills the open region to form a contact plug that electrically connects an underlying conductive layer to an overlying conductive layer. Alternatively, a conductive layer, a dielectric layer, and a conductive layer may be deposited into the open region in sequence to thereby form a metal-insulator-metal (MIM) capacitor having a cylindrical or concave structure.

As a design rule, as a semiconductor device gets smaller, the depth of the open region becomes deeper and a critical dimension (CD) of an open region becomes smaller. Accordingly, it is very difficult to stably form an open region with a high aspect ratio, for example, a plug hole for a metal contact (e.g., M1C) or a storage node hole of a cylindrical MIM capacitor.

FIG. 1 illustrates an open region of a typical semiconductor device wherein an open region 13 is formed in an insulation layer 12 formed on a substrate 11 including a predetermined structure. Region (A) illustrates a state in which the open region 13 is normally formed.

However, as illustrated in region (B), the typical semiconductor device has a limitation that a bottom CD W2 is smaller than a top CD W1 of the open region 13 (W1>W2). More specifically, although a dry etch is generally used to form the open region, the dry etch results in decreased etching efficiency as the open region 13 is etched deeper. This decreased efficiency is caused by a pressure inside the open region 13 that increases due to an etching gas and an etch by-product produced during the etching process. Such a decrease in the bottom CD W2 of the open region 13 leads to a leaning phenomenon of a storage node and a decrease in a preset capacitance of a capacitor in a semiconductor device. Furthermore, the decrease in the bottom CD W2 of the open region 13 causes a contact area of a contact plug with an underlying conductive layer to be reduced, thereby increasing a contact resistance there between.

Moreover, in line with the reduction in a design rule of a semiconductor device, a critical dimension of the open region 13 becomes smaller and a depth thereof becomes deeper. Accordingly, an etching margin for forming the open region 13 gradually decreases. This leads the bottom CD W2 to be much smaller than the top CD W1 in the open region 13, and as illustrated in the region (C) of FIG. 1, a contact-not-open phenomenon X also occurs.

SUMMARY

Embodiments are directed to providing a method of fabricating a semiconductor device, capable of ensuring a minimum bottom critical dimension (CD) required in an open region.

Embodiments are also directed to providing a method of fabricating a semiconductor device capable of preventing a contact-not-open phenomenon in an open region.

At least some embodiments are directed to a method for fabricating a semiconductor device that includes: forming an etch stop pattern over a conductive layer, the etch stop pattern having a first opening exposing a top surface of the conductive layer; forming an insulation layer over the etch stop pattern; selectively etching the insulation layer to form a second opening exposing the top surface of the conductive layer; and enlarging the second opening until the etch stop pattern is exposed. Herein, a top critical dimension (CD) of the second opening is equal to a critical dimension of the first opening.

In some embodiments, the insulation layer has a monolayered structure including one oxide layer, and the insulation layer has a multilayered structure including oxide layers with different wet etching rates. The insulation layer may have a multilayered structure including oxide layers with different wet etching rates, and the wet etching rates of the oxide layers gradually decrease from a lowermost oxide layer to an uppermost oxide layer.

In some embodiments, the forming of the insulation layer includes: forming a first oxide layer to cover the etch stop pattern having the first opening; forming a second oxide layer on the first oxide layer, the second oxide layer having a wet etching rate slower than the first oxide layer; and forming a third oxide layer on the second oxide layer, the third oxide layer having a wet etching rate slower than the second oxide layer.

Each of the first and second oxide layers may include a doped oxide layer containing an impurity, and a weight ratio (wt. %) of an impurity contained in the first oxide layer may be larger than that of an impurity contained in the second oxide layer.

An impurity contained in the first oxide layer may have a weight ratio of approximately 6 wt. % to approximately 10 wt. % with respect to a total weight of the first oxide layer, and an impurity contained in the second oxide layer may have a weight ratio of approximately 1 wt. % to approximately 5 wt. % with respect to a total weight of the second oxide layer. In some embodiments, the impurity comprises phosphor (P).

Each of the first and second oxide layers may include phosphorous silicate glass (PSG) or boron phosphorous silicate glass (BPSG), and the third oxide layer comprises plasma-enhanced tetraethylorthosilicate (PETEOS).

The etch stop pattern may include a nitride layer, and the first and second openings are formed through the same photomask. In some embodiments, the second opening is formed through a dry etching process, and the second opening is enlarged using a wet etching process. The second opening may be enlarged using a buffered oxide etchant (BOE) or a hydrofluoric (HF) acid solution.

The second opening may include a storage node hole used to form a storage node, or a contact hole used to form a contact plug.

According to other embodiments, a method of fabricating a capacitor of a semiconductor device includes: forming an etch stop pattern on a substrate including a storage node contact plug, the etch stop pattern having a first opening exposing a top surface of the storage node contact plug; forming an insulation layer on the etch stop pattern; selectively etching the insulation layer to form a second opening exposing the top surface of the storage node contact plug; enlarging the second opening until the etch stop pattern is exposed; forming a storage node along a surface profile of the second opening; and removing the insulation layer. In at least some embodiments, a top CD of the second opening is equal to a critical dimension of the first opening.

The formation of the etch stop pattern having the first opening includes: forming an interlayer dielectric (ILD) layer having a storage node contact plug on the substrate; recessing the ILD layer to protrude a portion of the storage node contact plug upward above the ILD layer; forming an etch stop layer to cover the storage node contact plug protruding above the ILD layer; and selectively etching the etch stop layer to form the first opening exposing the top surface of the storage node contact plug.

DESCRIPTION OF EMBODIMENTS

Other objects and advantages can be understood by the following description, and become apparent with reference to the disclosed embodiments.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

The embodiments described below relate to a method of forming an open region, such as a storage node hole or a contact hole of a semiconductor device, and particularly to a method for fabricating a semiconductor device having a minimum bottom critical dimension (CD) required in an open region having a high aspect ratio, by forming an etch stop pattern with an opening that defines a minimum bottom CD required in the open region.

In addition, the disclosed technical principle is applicable to all processes of forming an open region. In particular, it is possible to achieve excellent results when the disclosed method is applied to a process of forming an open region with a high aspect ratio. For example, the open region with a high aspect ratio may be a storage node contact hole for a storage node (SN), or an open region (e.g., M1C) used to form a metal contact plug.

Embodiments of a method of forming a contact plug are described below.

FIGS. 2A to 2D illustrate a method for fabricating a semiconductor device in accordance with a first embodiment.

Figure 1:
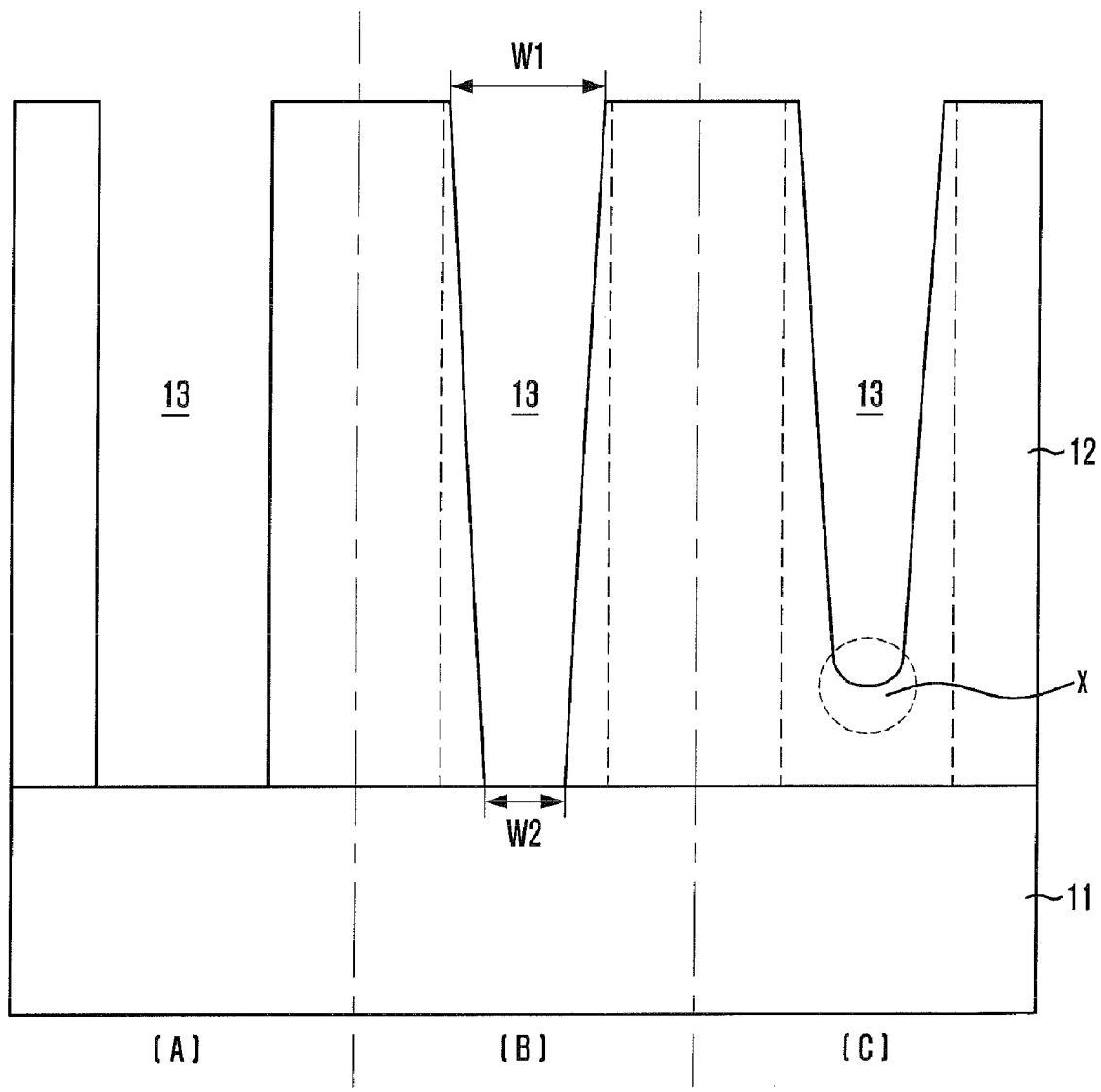
FIG. 1 illustrates an open region of a typical semiconductor device.
Figure 2A:
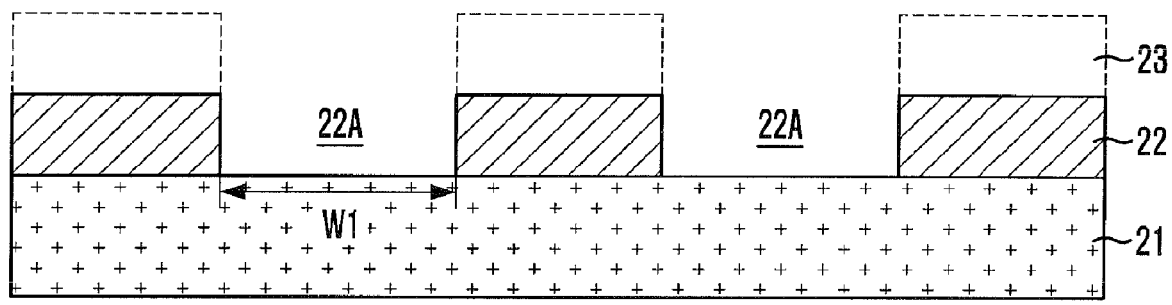
FIGS. 2A to 2D illustrate a method for fabricating a semiconductor device according to a first embodiment.

Referring to FIG. 2A, an etch stop layer (not shown) is formed on a conductive layer 21. The etch stop layer is formed to a thickness ranging from approximately 1,000 Å to approximately 2,000 Å so as to protect the underlying conductive layer 21 during a subsequent process. In some embodiments, the etch stop layer is formed of nitride, for example, silicon nitride ($Si_3N_4$).

A first etch barrier pattern 23 is formed on the etch stop layer. The first etch barrier pattern 23 may be formed of photoresist (PR). The etch stop layer is then etched using the first etch barrier pattern 23 as an etch barrier to form an etch barrier pattern 22 having a first opening 22A exposing the top surface of the conductive layer 21. The first opening 22A exposing the conductive layer 21 may have a critical dimension W1 allowing an open region to have the required minimum bottom CD. That is, the critical dimension W1 of the first opening 22A is equal to the minimum bottom CD required for the open region to be formed later.

In some embodiments, the first opening 22A is formed through a dry etch, for example, a plasma etch. In at least some embodiments, when the etch stop pattern 22 is formed of silicon nitride, the process of forming the first opening 22A using the plasma etch is performed using one of a plasma gas mixture containing fluorocarbon gas, fluoromethane gas, oxygen ($O_2$) gas and argon gas, a plasma gas mixture containing fluorocarbon gas and helium (He) gas, a plasma gas mixture containing a fluorocarbon gas and hydrogen ($H_2$) gas, and a plasma gas mixture containing fluoromethane gas and hydrogen gas. In at least some embodiments, the fluorocarbon gas includes $CF_4$, $C_2F_6$, $C_3F_8$, etc., and the fluoromethane gas includes $CHF_3$.

Meanwhile, a top critical dimension (top CD) and a bottom critical dimension (bottom CD) of the first opening 22A may differ from each other due to dry-etching characteristics, however, there is no difference between the top CD and the bottom CD of the first opening 22A even using the dry etching process because the etch stop pattern 22 has a small thickness, e.g., in the range of approximately 1,000 Å to approximately 2,000 Å.

The first etch barrier pattern 23 is removed. For example, when the first etch barrier pattern 23 is formed of photoresist, the first etch barrier pattern 23 may be removed using oxygen ($O_2$) plasma treatment. The first etch barrier pattern 23 may also be vanished and removed during the formation of the first opening 22A.

Figure 2B:
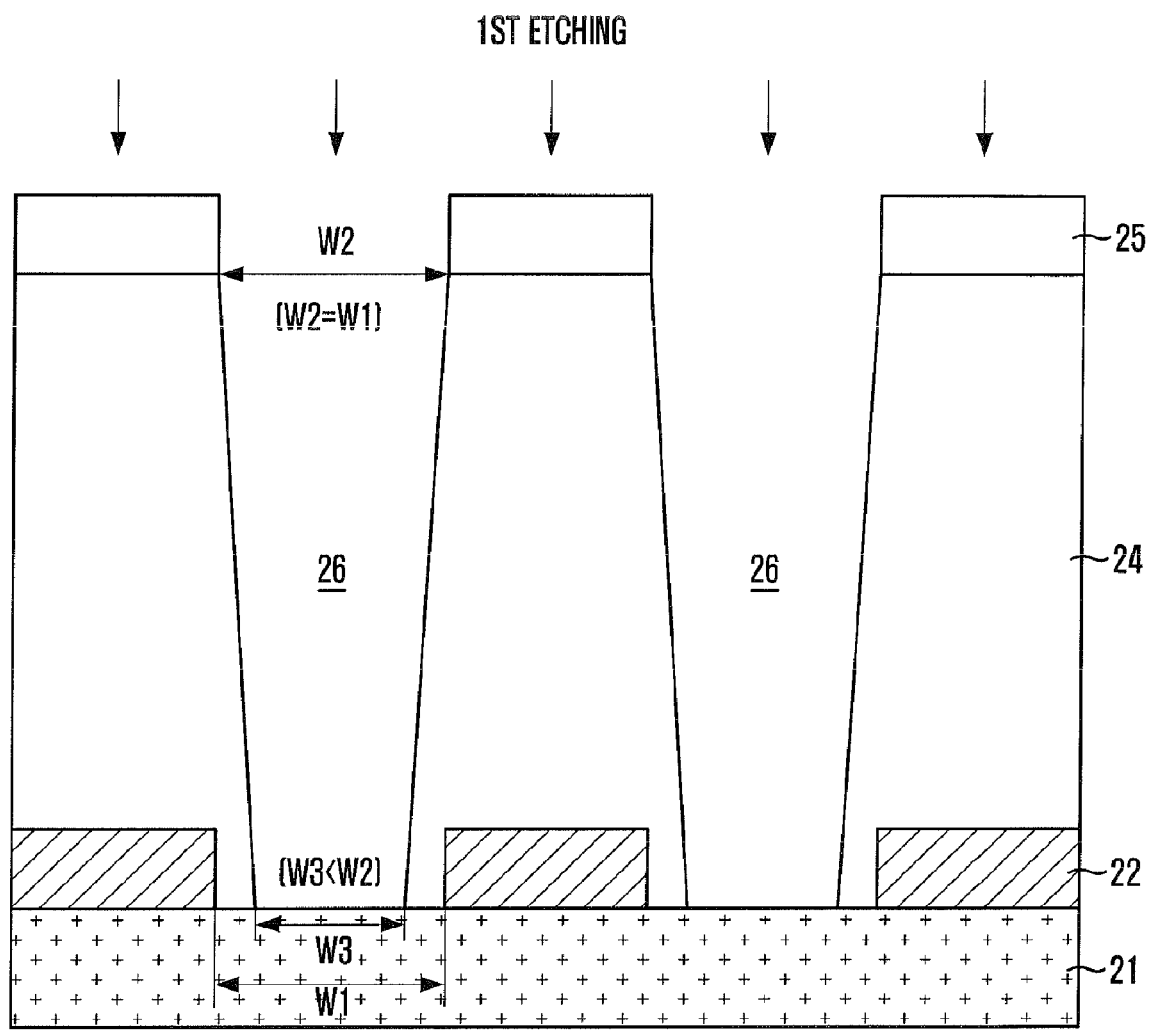

Referring to FIG. 2B, an insulation layer (not shown) is formed over the etch stop pattern 22 having the first opening 22A. More specifically, the insulation layer may be formed to fill the first opening 22A and also cover the top surface of the etch stop pattern 22.

In some embodiments, insulation layer includes an oxide layer. The oxide layer may include one of a silicon oxide ($SiO_2$) layer, a boron phosphorous silicate glass (BPSG), a phosphorous silicate glass (PSG), a tetraethylorthosilicate (TEOS), an undoped silicate glass (USG), a spin-on-glass (SOG), a high-density plasma (HDP) oxide layer, and a spin-on-dielectric (SOD) layer.

A second etch barrier pattern 25 is formed on the insulation layer. The second etch barrier pattern 25 may be identical to the first etch barrier pattern 23. That is, the first and second etch barrier patterns 23 and 25 may be formed using the same photomask, and therefore, an opening of the first etch barrier pattern 23 may be equal in width to an opening of the second etch barrier pattern 25.

The second etch barrier pattern 25, which serves as an etch barrier when the insulation layer is etched to form an open region, may be formed of oxide, nitride, oxynitride, amorphous carbon, or a multilayer thereof.

The insulation layer is etched using the second etch barrier pattern 25 as an etch barrier to form an insulation pattern 24 and a second opening exposing the top surface of the conductive layer 21. Herein, the second opening 26 has a top CD2 equal to the critical dimension W1 of the first opening 22A. The second opening 26 is typically called 'open region'. Hereinafter, the etching process of forming the second opening 26 is abbreviated to 'primary etch'. The primary etch may be performed using a dry etching process, for example, plasma etching process.

For example, the primary etching process of forming the second opening 26 may be performed using one of a plasma gas mixture containing fluorocarbon gas and fluoromethane gas, a plasma gas mixture containing fluorocarbon gas, fluoromethane gas and argon gas, a plasma gas mixture containing a fluorocarbon gas and hydrogen ($H_2$) gas, and a plasma gas mixture containing fluoromethane gas and carbon dioxide ($CO_2$) gas. A pressure inside the second opening 26 increases due to an etching gas and etch by-products produced during the etching of the insulation layer and may cause reduced etching efficiency as the second opening 26 is etched deeper. Accordingly, In some embodiments, the bottom CD W3 of the second opening 26 is smaller than the top CD W3 (W2>W3).

The top CD W2 of the second opening 26 is equal to the critical dimension W1 of the first opening 22A because the first and second etch barrier patterns 23 and 25 are formed using the same photomask (W1=W2). Due to etching characteristics during the primary etch, the bottom CD W3 of the second opening 26 is smaller than the minimum bottom CD of the second opening 26, i.e., the critical dimension W1 of the first opening 22A (W1>W3).

In summary, since the second etch barrier pattern 25 having the same opening as the first etch barrier pattern 23 is used as an etch barrier during the primary etch and the bottom CD W3 of the second opening 26 is smaller than the top CD W2, the sidewall of the etch stop pattern 22 is not exposed although the second opening 26 is formed through the primary etch. That is, it is impossible to ensure the minimum bottom CD required for the second opening 26 only through the primary etch.

Figure 2C:
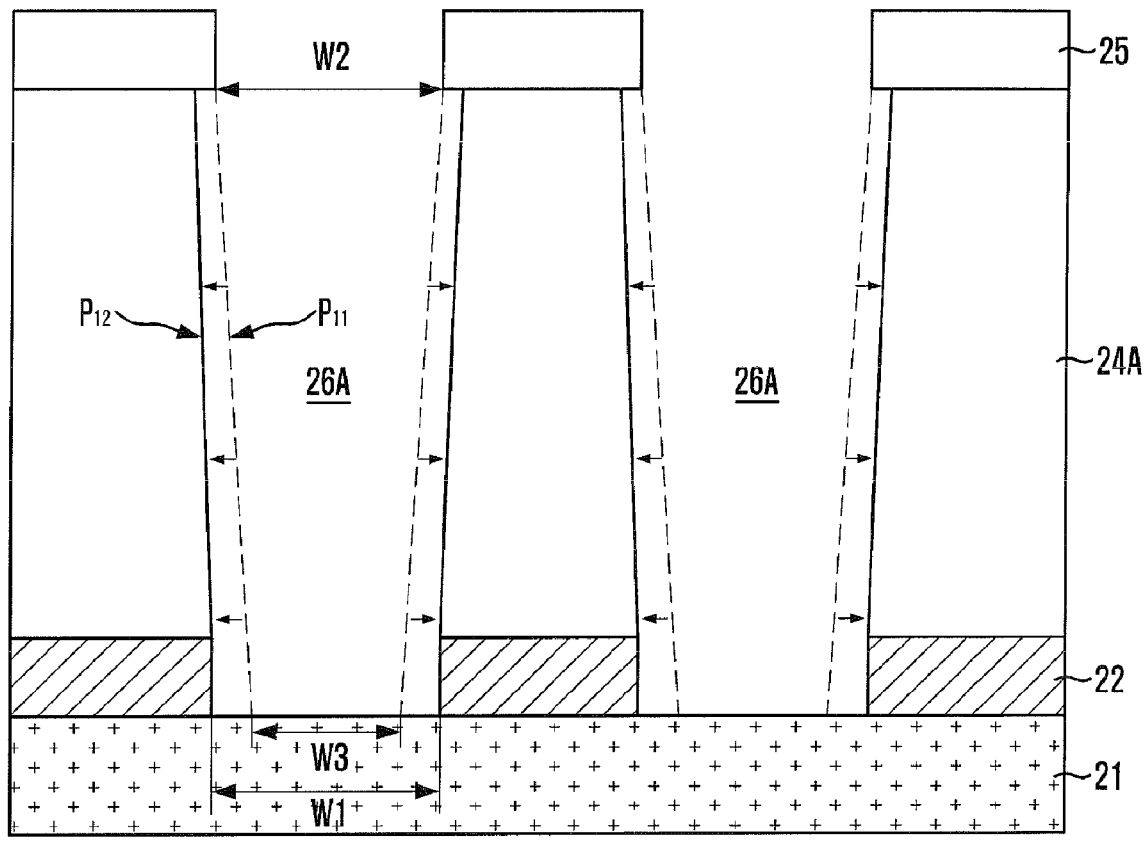

Therefore, to ensure the minimum bottom CD required for the second opening 26, the sidewall of the insulation pattern 24 is additionally etched to expose the sidewall of the etch stop pattern 22 as illustrated in FIG. 2C. At the same time, a third opening 26A is formed, which is larger than the second opening 26. Hereinafter, the etching process of exposing the sidewall of the etch stop pattern 22 will be abbreviated to 'secondary etch'. Meanwhile, a portion of the top surface as well as the sidewall of the etch stop pattern 22 may be exposed during the secondary etch. Reference numeral 24A denotes the narrowed insulation pattern.

In some embodiments, the secondary etch is performed using a wet etching process. For instance, in case where the insulation pattern 24 is formed of oxide, the secondary etch of exposing the sidewall of the etch stop pattern 22 may be performed using a buffered oxide etchant (BOE) or a hydrofluoric acid (HF) solution. By controlling process conditions such as an etchant concentration and an etching time, it is possible to control an exposed area of the sidewall of the etch stop pattern 22, an exposed area of the top surface of the etch stop pattern 22, and a space between adjacent third openings 26A.

An etching chemical, such as BOE or HF solution, is used in the secondary etch, and is an etchant for etching oxides in order that the etch stop pattern 22 formed of nitride is not etched but only the insulation pattern 24 formed of oxide is etched.

As described above, the sidewall of the etch stop pattern 22 is exposed through narrowing the sidewall of the insulation pattern from $P_{11}$ to $P_{12}$ through the secondary etch, thereby ensuring the minimum bottom CD required for the third opening 26A. Also, it is possible to prevent a contact-not-open phenomenon from occurring due to lack of an etching margin during the secondary etch of forming the third opening 26A. Specifically, although the insulation layer remains on the bottom of the third opening 26A due to lack of the etching margin during the primary etch of forming the second opening 26, that is, although the contact-not-open phenomenon occurs, the insulation layer remaining on the bottom of the second opening 26 can be removed through the secondary etching process. Accordingly, it is possible to improve the fabricating yield of a semiconductor device.

As the sidewall of the insulation pattern 24 is narrowed from $P_{11}$ to $P_{12}$, the top CD W2 as well as the bottom CD W3 of the third opening 26A can be enlarged. Therefore, process conditions such as an etchant concentration and an etching time should be controlled in consideration of a space between the adjacent third openings 26A during the secondary etch.

Figure 2D:
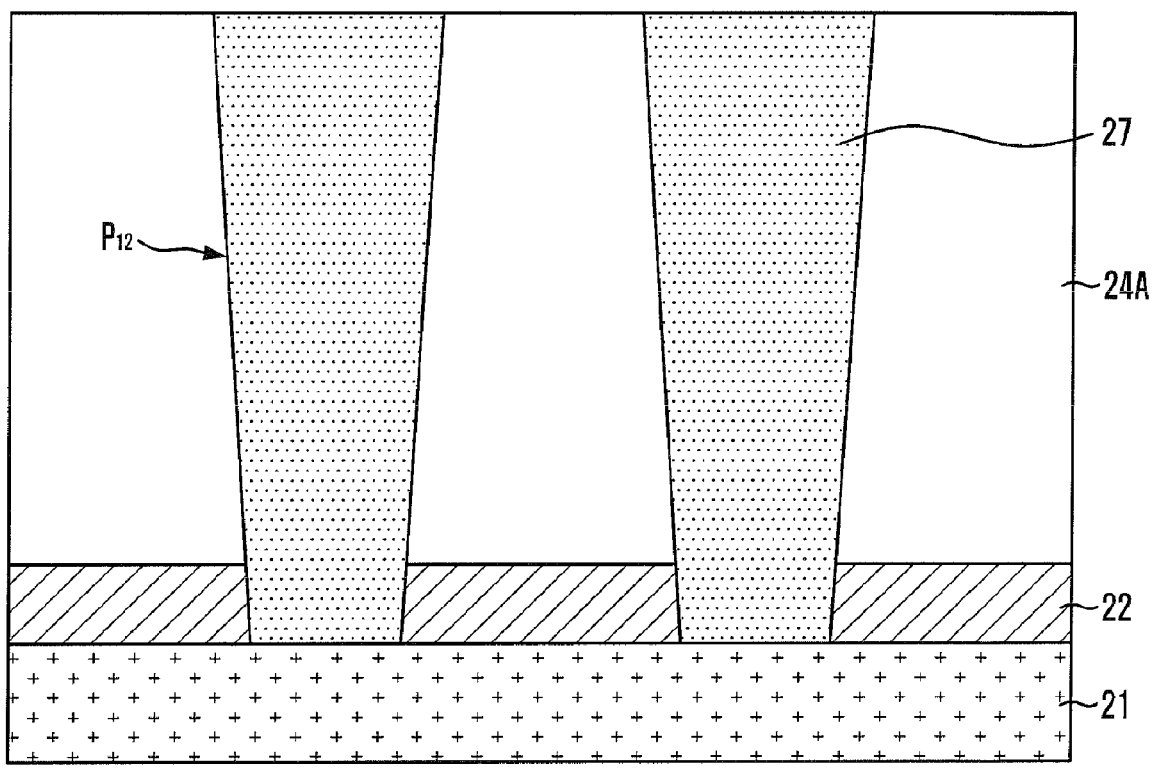

Referring to FIG. 2D, the second etch barrier pattern 25 is removed, and a conductive layer fills the third opening 26A to form a contact plug 27. The conductive layer for the contact plug 27 may include a monolayer selected from the group consisting of a polysilicon layer, a metal layer, a conductive metal nitride layer, a conductive metal oxide layer, and a metal silicide layer, or a multilayer thereof. The metal layer may include an aluminum (Al) layer, a titanium (Ti) layer, a tungsten (W) layer, or the like. The conductive metal nitride layer may include a titanium nitride (TiN) layer, and the conductive metal oxide layer may include an iridium oxide ($IrO_2$) layer. The metal silicide layer may include titanium silicide (TiSi) layer, a tungsten silicide (WSi) layer, or the like.

Through the above-described process, the contact plug 27 may be formed, ensuring the minimum bottom CD. For reference, when the contact plug 27 cannot have the minimum bottom CD, a contact area between the conductive layer 21 and the contact plug 27 decreases, which may cause a contact resistance to be increased therebetween. The increase in contact resistance means that a signal transmission is delayed between the conductive layer 21 and the contact plug 27. When the signal transmission is delayed, operation characteristics of a semiconductor device may deteriorate.

The minimum bottom CD required for the third opening 26A can be attained by forming the etch stop pattern 22 having the first opening 22A defining the minimum bottom CD required for the third opening 26A, i.e., an open region. This can improve the operation characteristics of the semiconductor device and the fabricating yield.

A second embodiment of a method for fabricating a semiconductor device, which can ensure a bottom CD required for an open region and also prevent a top CD of the open region from being increased during a process of forming a contact plug is described below and illustrated in FIGS. 3A to 3C. If the top CD of the open region increases, adjacent contact plugs are electrically shorted because a space between adjacent open regions gets smaller. Detailed description for portions similar to those of the first embodiment will be omitted herein, and thus following description will be focused on differences between the first and second embodiments.

Figure 3A:
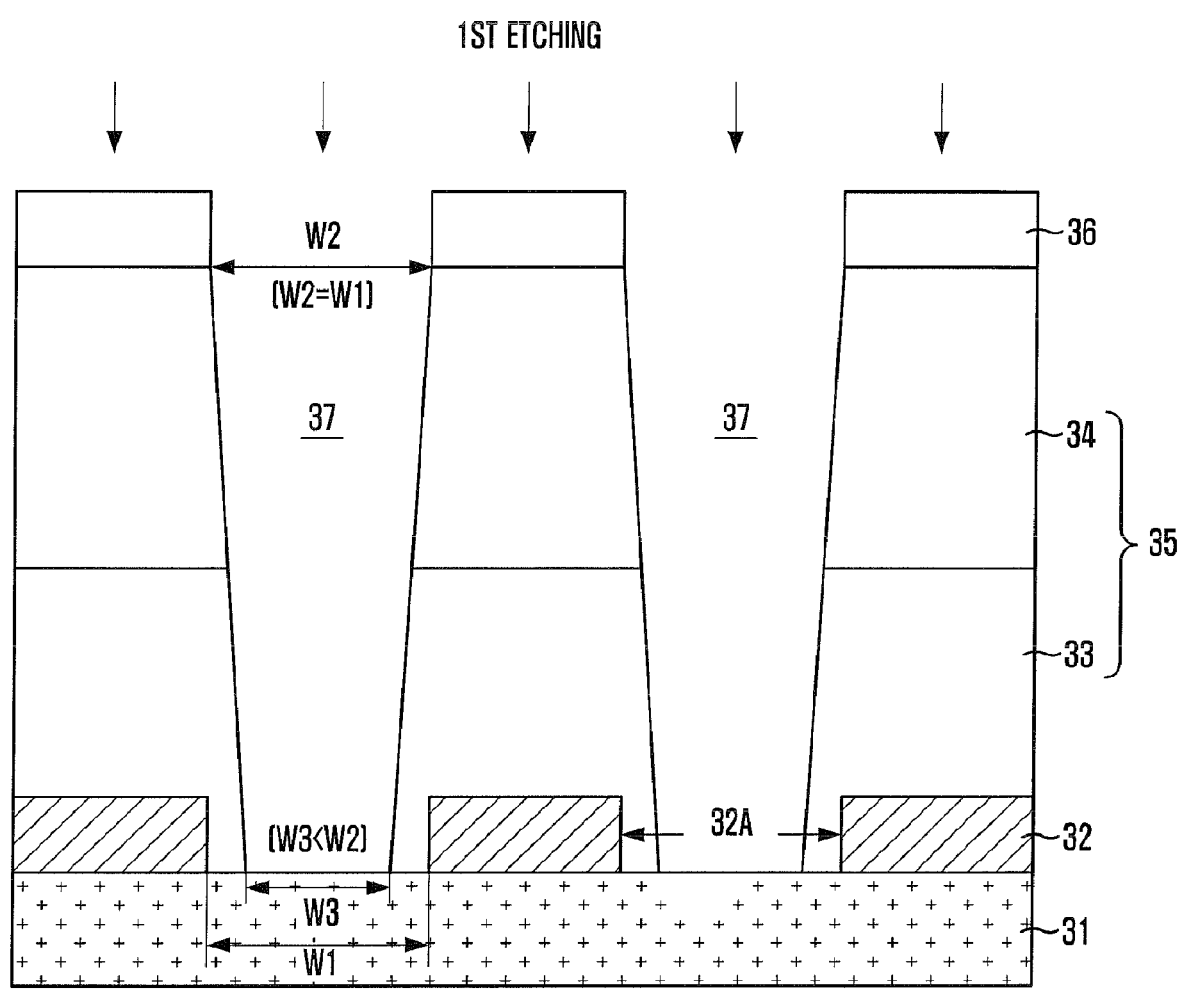
FIGS. 3A to 3C illustrate a method for fabricating a semiconductor device according to a second embodiment.

Referring to FIG. 3A, an etch stop layer (not shown) with a thickness ranging from approximately 1,000 Å to approximately 2,000 Å and a first etch barrier pattern (not shown) are sequentially formed on a conductive layer 31, and the etch stop layer is then etched using the first etch barrier pattern as an etch barrier to form an etch stop pattern 32 and a first opening 32A exposing the top surface of the conductive layer 31. The first opening 32A may have a critical dimension W1 equal to the minimum bottom CD required for an open region to be formed later. The etch stop pattern 32 may be formed of nitride, for example, silicon nitride ($Si_3N_4$).

An insulation layer (not shown) is formed over a resultant structure including the etch stop pattern 32. In some embodiments, the insulation layer includes an oxide layer. The oxide layer may include one of a silicon oxide ($SiO_2$) layer, a boron phosphorous silicate glass (BPSG), a phosphorous silicate glass (PSG), a tetraethylorthosilicate (TEOS), an undoped silicate glass (USG), a spin-on-glass (SOG), a high-density plasma (HDP) oxide layer, and a spin-on-dielectric (SOD) layer.

The insulation layer may have a multilayered structure including oxide layers with different wet etching rates in order to ensure the minimum bottom CD required for an open region to be formed later and also prevent a preset top CD of the open region from being increased. In some embodiments, the insulation layer may have a multilayered structure including oxide layers with different wet etching rates in which the wet etching rates of the oxide layers gradually decrease from the lowermost oxide layer to the uppermost oxide layer.

For example, the insulation layer may be provided with a first oxide layer and a second oxide layer on the first oxide layer. The first oxide layer fills the first opening 32A and also covers the top surface of the etch stop pattern 32. The second oxide layer is formed of a material of which an etching rate is slower than that of the first oxide layer. The first oxide layer may be formed of an impurity-doped oxide. Herein, the impurity may contain phosphor (P). Therefore, the first oxide layer may be formed of a phosphor-containing oxide, e.g., BPSG or PSG. The second oxide layer may be formed of an undoped oxide that is not doped with impurities. To be specific, the second oxide layer may be formed of plasma-enhanced tetraethylorthosilicate (PETEOS). For reference, it is known that PSG or BPSG has a wet etching rate faster than PETEOS.

To more effectively ensure the minimum bottom CD required for the open region and simultaneously prevent the top CD of the open region from being increased during a subsequent process, in some embodiments, a difference between wet etching rates of the first and second oxide layers is increased. To be specific, the oxide layer containing an impurity, e.g., phosphor (P) forming the first oxide layer may vary its wet etching rate depending on a weight ratio of the impurity. For reference, it is known that the wet etching rate increases as the weight ratio or content ratio of the impurity in the oxide layer increases. Therefore, the weight ratio of the impurity in the first oxide layer may be controlled to be in the range of approximately 1 wt. % to approximately 10 wt. % with respect to a total weight of the first oxide layer. When the weight ratio of the impurity in the first oxide layer is less than approximately 1 wt. %, the second oxide layer cannot have a wet etching rate that is faster than that of PETEOS. When the weight ratio of the impurity in the first oxide layer exceeds approximately 10 wt. %, the first oxide layer has poor properties so that it cannot serve as an insulator.

A second etch barrier pattern 36 is formed on the insulation layer, i.e., the second oxide layer. The second etch barrier pattern 36 may be identical to the first etch barrier pattern used to form the first opening 32A. That is, the second etch barrier pattern 36 may be formed using the same mask as the first etch barrier pattern. Therefore, the opening of the first etch barrier pattern may be equal in width to an opening of the second etch barrier pattern 36.

The second etch barrier pattern 36 serves as an etch barrier during the etching process of the insulation layer to form an open region. The second etch barrier pattern 36 may be formed of oxide, nitride, oxynitride, amorphous carbon, or a multilayer thereof.

The insulation layer including the first and second oxide layers is etched using the second etch barrier pattern 36 as an etch barrier to expose the top surface of the conductive layer 31, and form a second opening 37 of which a top CD W2 is equal to the critical dimension W1 of the first opening 32A. Through the etching process, the insulation layer changes into an insulation pattern 35 including a first oxide pattern 33 and a second oxide pattern 34. The second opening 37 is typically called 'open region'. Hereinafter, the etching process of forming the second opening 37 is abbreviated to 'primary etch'. In some embodiments, the primary etch is performed using a dry etching process, for example, plasma etching process.

A pressure inside the second opening 37 increases due to an etching gas and etch by-products produced during the etching of the insulation layer. This may cause the etching efficiency to be poorer as the second opening 37 is etched deeper. Accordingly, the bottom CD W3 of the second opening 37 may be smaller than the top CD W3 (W2>W3).

Because the same photomask is used for the second etch barrier pattern 36 and the first etch barrier pattern, the top CD W2 of the second opening 37 is equal to the critical dimension W1 of the first opening 32A (W1=W2). Due to etching characteristics during the primary etch, however, the bottom CD W3 of the second opening 26 is smaller than the minimum bottom CD of the second opening 26, i.e., the critical dimension W1 of the first opening 22A (W1>W3).

Although the insulation layer has a multilayered structure where oxide layers with different wet etching rates, i.e., first and second oxide layer, are stacked, the etching rates of the first and second oxide layers in vertical and horizontal directions are equal to each other.

In summary, because the second etch barrier pattern 36 having the same opening as the first etch barrier pattern is used as an etch barrier during the primary etch and the bottom CD W3 of the second opening 37 is smaller than the top CD W2, the sidewall of the etch stop pattern 32 is not exposed although the second opening 37 is formed through the primary etch. Therefore, it is impossible to ensure the minimum bottom CD required for the second opening 37 only through the primary etch.

Figure 3B:
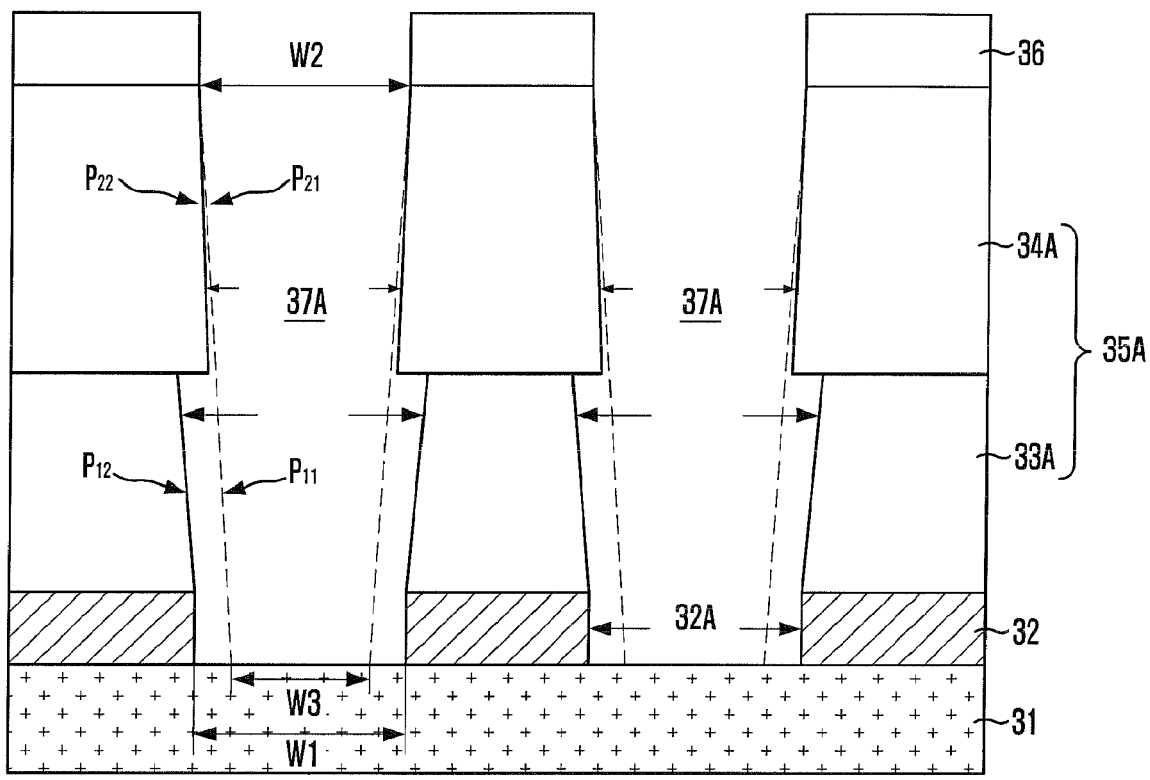

Therefore, as illustrated in FIG. 3B, to ensure the minimum bottom CD required for the second opening 37, the sidewall of the insulation pattern 35 is additionally etched to expose the sidewall of the etch stop pattern 32. At the same time, a third opening 37A is formed, which is larger than the second opening 37. Hereinafter, the etching process of exposing the sidewall of the etch stop pattern 32 will be abbreviated to 'secondary etch'. Reference numeral 35A denotes the narrowed insulation pattern, and reference numerals 33A and 34A denote the narrowed first and second oxide patterns, respectively.

In some embodiments a portion of the top surface of the etch stop pattern 32 as well as the sidewall of the etch stop pattern 32 is exposed during the secondary etch.

The secondary etch may be performed using a wet etching. For instance, in case where the insulation pattern 35 is formed of oxide, the secondary etch of exposing the sidewall of the etch stop pattern 32 may be performed using a buffered oxide etchant (BOE) or a hydrofluoric acid (HF) solution. By controlling process conditions such as an etchant concentration and an etching time, it is possible to control an exposed area of the sidewall of the etch stop pattern 32, an exposed area of the top surface of the etch stop pattern 32, and a space between adjacent third openings 37A.

Here, an etching chemical used in the secondary etch, that is, the BOE or HF solution, is an etchant for etching oxides, so that the etch stop pattern 32 formed of nitride is not etched but only the insulation pattern 34 formed of oxide is etched.

As described above, the sidewall of the etch stop pattern 32 is exposed through narrowing the sidewall of the first oxide pattern 33 from $P_{11}$ to $P_{12}$ through the secondary etch, thereby ensuring the minimum bottom CD required for the third opening 37A.

Further, it is possible to prevent a contact-not-open phenomenon from occurring due to lack of an etching margin during the secondary etch of forming the third opening 37A. Specifically, although the insulation layer remains on the bottom of the third opening 37A due to lack of the etching margin during the primary etch of forming the second opening 37, the insulation layer remaining on the bottom of the third opening 37A can be removed through the secondary etching process. Accordingly, it is possible to prevent the contact-not-open phenomenon from occurring.

As the sidewall of the first oxide pattern 35 is narrowed from $P_{11}$ to $P_{12}$, the top CD W2 of the third opening 37A may be enlarged. Therefore, if the top CD W2 of the third opening 37A increases, a space between the adjacent openings 37A decreases, which may cause adjacent contact plugs filling the third openings 37A to be electrically shorted.

However, the second oxide pattern 34 has a wet etching rate slower than the first oxide layer, and thus the second oxide pattern 34 is narrowed little from $P_{21}$ to $P_{22}$ while the first oxide pattern 33 is narrowed from $P_{11}$ to $P_{12}$ to ensure the minimum bottom CD required for the third opening 37A. In other words, the second oxide pattern 34 is formed of a material having a wet etching rate slower than the first oxide pattern 33, making it possible to prevent the top CD W2 of the third opening 37A from being increased during the secondary etch.

In this way, the insulation pattern 35 has the multilayered structure where the oxide layers with different wet etching rates are stacked, so that it is possible to ensure the minimum bottom CD required for the third opening 37A, and prevent the top CD W2 of the second opening 37 from being increased.

Figure 3C:
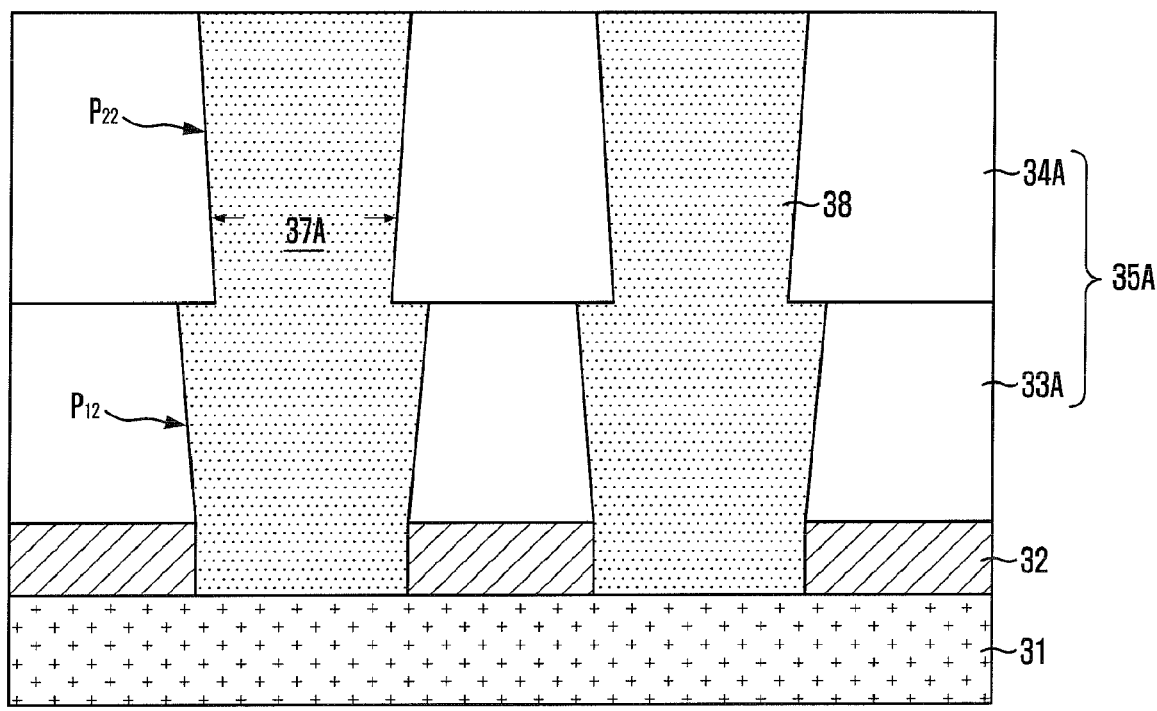

Referring to FIG. 3C, the second etch barrier pattern 36 is removed, and a conductive layer then fills the third opening 37A to form a contact plug 38.

Therefore, disclosed embodiments can provide a method for fabricating the contact plug 38 having the minimum bottom CD. If the contact plug 38 does not ensure the minimum bottom CD, a contact area between the conductive layer 31 and the contact plug 38 decreases, which may increase a contact resistance therebetween. The increase in contact resistance means that a signal transmission is delayed between the conductive layer 31 and the contact plug 38. When the signal transmission is delayed, operation characteristics of a semiconductor device may deteriorate.

Furthermore, the inventive method can prevent adjacent contact plugs 38 from being electrically shorted through ensuring a space between the adjacent contact plugs 38.

As illustrated in the first and second embodiments, the first opening defining the minimum bottom CD required for the open region is formed in advance, thereby ensuring the minimum bottom CD required for the open region.

In addition, the insulation layer is provided with the oxide layers with different wet etching rates defining the open region, so that it is possible to easily ensure the minimum bottom CD required for the open region. Moreover, the disclosed method can prevent the top CD of the preset open region from being increased.

Consequently, it is possible to prevent adjacent contact plugs from being electrically shorted by forming the contact plug with the minimum bottom CD and ensuring the space between the adjacent contact plugs. Accordingly, improve operation characteristics and increased yield of semiconductor devices can be obtained.

Herebelow, third and fourth embodiments apply to a method for fabricating a cylindrical metal-insulator-metal (MIM) capacitor of a semiconductor device.

FIGS. 4A to 4F illustrate a method for fabricating a semiconductor device in accordance with a third embodiment.

Figure 4A:
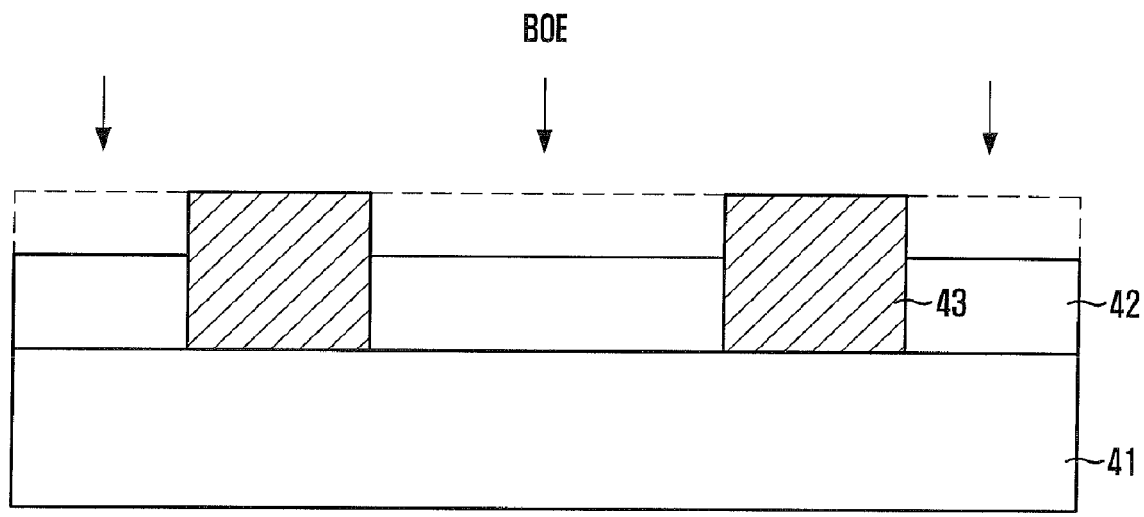
FIGS. 4A to 4F illustrate a method for fabricating a semiconductor device according to a third embodiment.

Referring to FIG. 4A, an interlayer dielectric (ILD) layer (not shown) is formed on a substrate 41 including a predetermined structure, for example, a transistor, a landing plug, etc. The ILD layer may include an oxide layer. The oxide layer may include one of a silicon oxide ($SiO_2$) layer, a boron phosphorous silicate glass (BPSG), a phosphorous silicate glass (PSG), a tetraethylorthosilicate (TEOS), an undoped silicate glass (USG), a spin-on-glass (SOG), a high-density plasma (HDP) oxide layer, and a spin-on-dielectric (SOD) layer.

The ILD layer is selectively etched to form a storage node contact hole, and a conductive layer then fills the storage node contact hole to form a storage node contact plug 43. The storage node contact plug 43 may include a monolayer selected from the group consisting of a polysilicon layer, a metal layer, a conductive metal nitride layer, a conductive metal oxide layer, and a metal silicide layer, or a multilayer thereof. The metal layer may include an aluminum (Al) layer, a titanium (Ti) layer, a tungsten (W) layer, or the like. The conductive metal nitride layer may include a titanium nitride (TiN) layer, and the conductive metal oxide layer may include an iridium oxide ($IrO_2$) layer. In some embodiments, the metal silicide layer includes, but is not limited to a titanium silicide (TiSi) layer and a tungsten silicide (WSi) layer.

The ILD layer is recessed such that the storage node contact plug 43 protrudes higher than the top surface of the recessed ILD layer. Hereinafter, the recessed ILD layer will be referred to as an ILD pattern 42. The recess process may be performed through a wet etching. The ILD layer may be recessed to an etch depth ranging from approximately 500 Å to approximately 1,500 Å below the top surface of the storage node contact plug 43, thus forming the ILD pattern 42. Here, the recess process may be performed using a BOE solution or HF solution if the ILD layer is formed of oxide, which allows a portion of the storage node contact plug 43 to protrude above the top surface of the ILD pattern 42 by a height ranging from approximately 500 Å to approximately 1,500 Å.

Figure 4B:
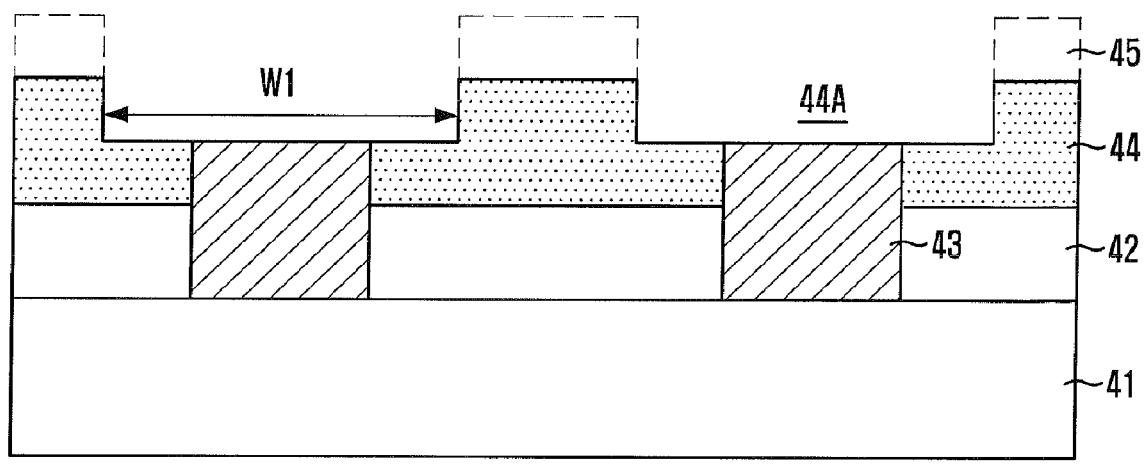

Referring to FIG. 4B, an etch stop layer (not shown) is formed to cover the storage node contact plug 43 protruding upward above the ILD pattern 42. The etch stop layer, which is used to protect a structure under the storage node during a subsequent wet dip-out process, may be formed to a thickness ranging from approximately 1,000 Å to approximately 2,000 Å based on the top surface of the ILD pattern 42. The etch stop layer may be formed of nitride, for example, $Si_3N_4$.

A stepped portion of the etch stop layer may be formed on the top surface thereof due to the storage node contact plug 43 protruding upward above the ILD pattern 42. In some embodiments, the stepped portion of the etch stop layer is removed because it has a detrimental effect on a subsequent process. Therefore, a planarization may be additionally performed to remove the stepped portion. The planarization may be performed using chemical mechanical polishing (CMP) or etchback process.

A first etch barrier pattern 45 is formed on the etch stop layer. The etch barrier pattern 45 may be formed of photoresist (PR).

The etch stop layer is etched using the first etch barrier pattern 45 as an etch barrier to form an etch stop pattern 44 having a first opening 44A exposing the top surface of the storage node contact plug 43. The critical dimension W1 of the first opening 44A may have the minimum bottom CD required for an open region to be formed later. That is, the critical dimension W1 of the first opening 44A is equal to the minimum bottom CD required for the open region.

The etching process of forming the first opening 44A may be performed through dry etch such as plasma etch. For example, when the etch stop layer is formed of silicon nitride, the process of forming the first opening 44A using the plasma etch may be performed using one of a plasma gas mixture containing fluorocarbon gas, fluoromethane gas, oxygen ($O_2$) gas and argon gas, a plasma gas mixture containing fluorocarbon gas and helium (He) gas, a plasma gas mixture containing a fluorocarbon gas and hydrogen ($H_2$) gas, and a plasma gas mixture containing fluoromethane gas and hydrogen gas. Here, the fluorocarbon gas may include $CF_4$, $C_2F_6$, $C_3F_8$, etc., and the fluoromethane gas may include $CHF_3$.

Meanwhile, the top CD and the bottom CD of the first opening 22A may differ from each other due to dry etching characteristics, however, there is no difference between the top CD and the bottom CD of the first opening 44A even using the dry etching process in the present invention because the etch stop layer has a small thickness, e.g., in the range of approximately 1,000 Å to approximately 2,000 Å.

The first etch barrier pattern 45 is removed. For example, when the first etch barrier pattern 45 is formed of photoresist, the first etch barrier pattern 45 may be removed using oxygen ($O_2$) plasma treatment. The first etch barrier pattern 45 may also be vanished and removed during the formation of the first opening 44A.

Figure 4C:
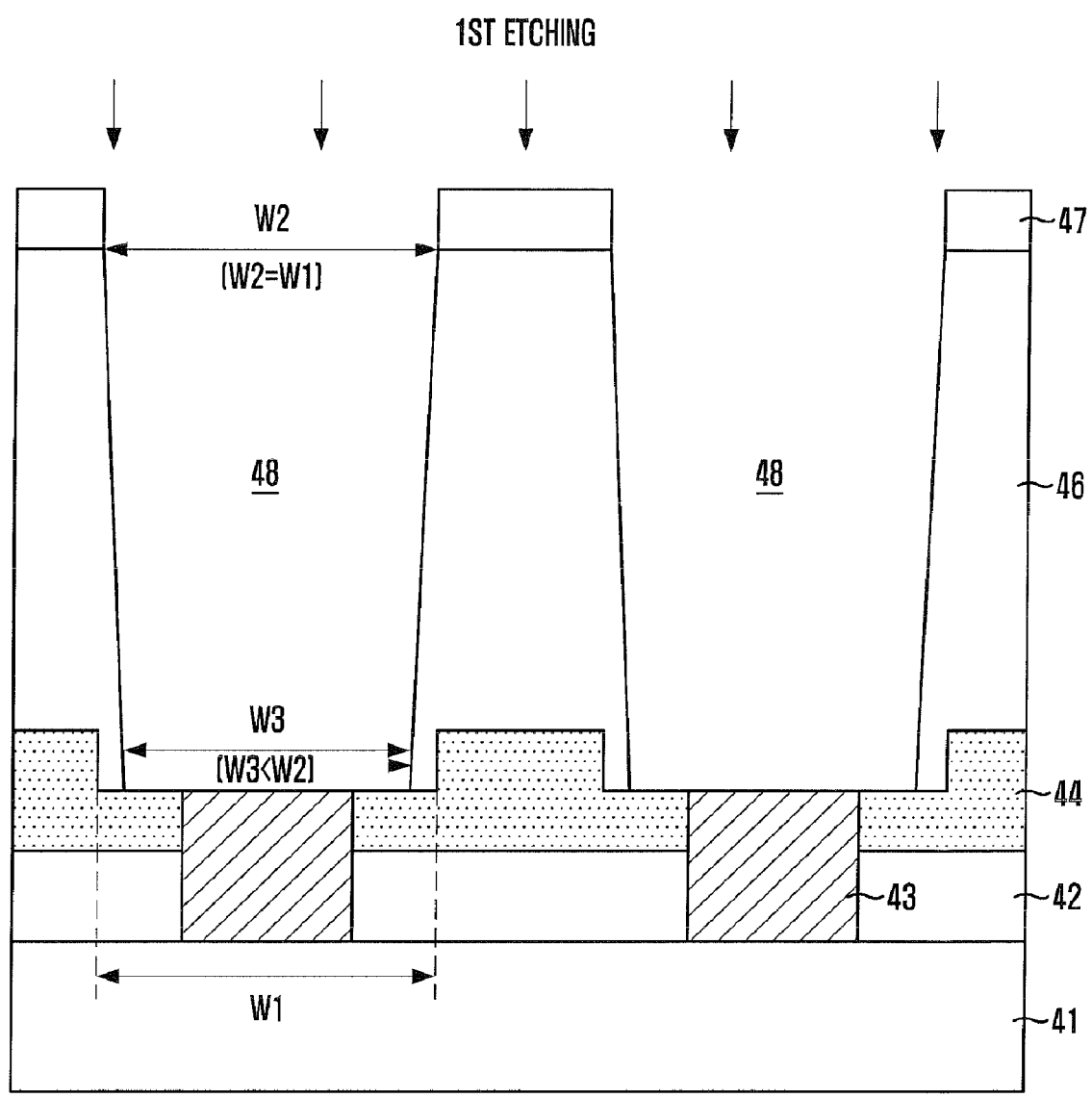

Referring to FIG. 4C, an isolation insulation layer is formed on a resultant structure including the etch stop pattern 44 and the first opening 44A. To be specific, the isolation insulation layer may be formed to fill the first opening 44A and cover the top surface of the etch stop pattern 44 as well. The isolation insulation layer may be formed of an oxide.

The isolation insulation layer, which provides a three dimensional structure where a storage node will be formed, may be formed to a thickness ranging from approximately 10,000 Å to approximately 30,000 Å.

A second etch barrier pattern 47 is formed on the isolation insulation layer. The second etch barrier pattern 47 may be identical to the first etch barrier pattern 45. That is, the second etch barrier pattern 47 may be formed using the same photomask used in the first etch barrier pattern 45. Therefore, an opening of the first etch barrier pattern 45 may be equal in width to an opening of the second etch barrier pattern 47.

The second etch barrier pattern 47, which serves as an etch barrier when the isolation insulation layer is etched to form an open region, may be formed of an oxide, nitride, oxynitride, amorphous carbon, or a multilayer thereof. The isolation insulation layer is etched using the second etch barrier pattern 47 as an etch barrier to form an isolation insulation pattern 46 and a second opening exposing the top surface of the storage node contact plug 43. The second opening 48 has a top CD W2 equal to the critical dimension W1 of the first opening 44A. Hereinafter, the etching process of forming the second opening is abbreviated to 'primary etch'. The primary etch may be performed using a dry etching process, e.g., plasma etching process.

For example, when the isolation insulation layer is formed of an oxide, the primary etching process of forming the second opening 48 may be performed using one of a plasma gas mixture containing fluorocarbon gas and fluoromethane gas, a plasma gas mixture containing fluorocarbon gas, fluoromethane gas and argon gas, a plasma gas mixture containing a fluorocarbon gas and hydrogen ($H_2$) gas, and a plasma gas mixture containing fluoromethane gas and carbon dioxide ($CO_2$) gas. A pressure inside the second opening 48 increases due to an etching gas and etch by-products produced during the etching of the isolation insulation layer. This may cause the etching efficiency to be poorer as the second opening 48 is etched deeper. Accordingly, the bottom CD W3 of the second opening 48 may be smaller than the top CD W3 (W2>W3).

Here, the top CD W2 of the second opening 48 is equal to the critical dimension W1 of the first opening 44A because the first and second etch barrier patterns 45 and 47 are formed using the same photomask (i.e., W1=W2). Due to etching characteristics during the primary etch, the bottom CD W3 of the second opening 48 is smaller than the minimum bottom CD of the second opening 48, i.e., the critical dimension W1 of the first opening 44A (W1>W3).

In summary, since the second etch barrier pattern 47 having the same opening as the first etch barrier pattern 45 is used as an etch barrier during the primary etch and the bottom CD W3 of the second opening 48 is smaller than the top CD W2, the sidewall of the etch stop pattern 44 is not exposed although the second opening 48 is formed through the primary etch. That is, it is impossible to ensure the minimum bottom CD required for the second opening 48 only through the primary etch.

Figure 4D:
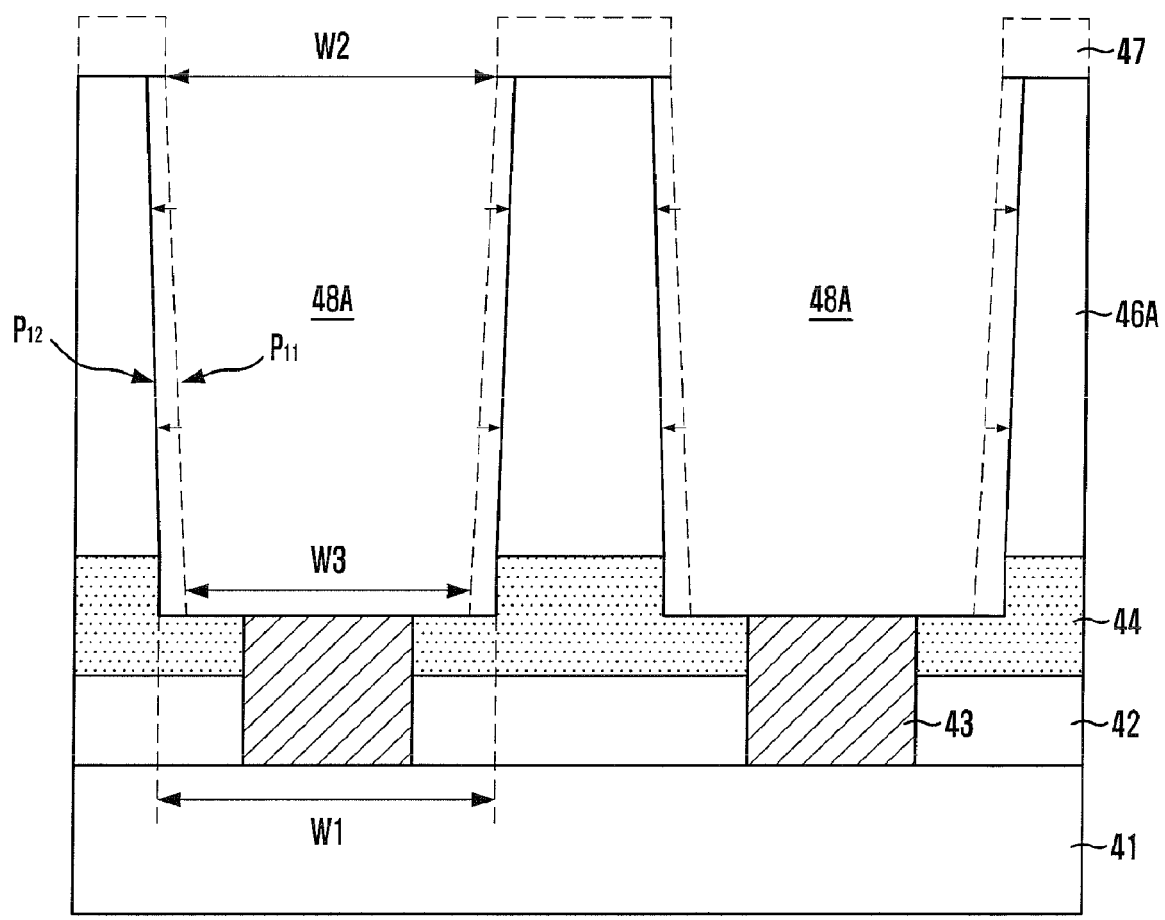

Therefore, to ensure the minimum bottom CD required for the second opening 48, the sidewall of the isolation insulation pattern 46 is additionally etched to expose the sidewall of the etch stop pattern 44, as illustrated in FIG. 4D. At the same time, a third opening 48A is formed, which is larger than the second opening 48. Hereinafter, the etching process of exposing the sidewall of the etch stop pattern 44 will be abbreviated to 'secondary etch,' and reference numeral 46A denotes the narrowed isolation insulation pattern.

In addition, a portion of the top surface of the etch stop pattern 44 as well as the sidewall of the etch stop pattern 44 may also be exposed during the secondary etch.

The secondary etch may be performed using a wet etching. For instance, in case where the isolation insulation layer is formed of oxide, the secondary etch of exposing the sidewall of the etch stop pattern 44 may be performed using a buffered oxide etchant (BOE) or a hydrofluoric acid (HF) solution. By controlling process conditions such as an etchant concentration and an etching time, it is possible to control an exposed area of the sidewall of the etch stop pattern 44, an exposed area of the top surface of the etch stop pattern 44, and a space between adjacent third openings 48A.

Herein, an etching chemical used in the secondary etch, that is, the BOE or HF solution, is an etchant for etching oxides, so that the etch stop pattern 44 formed of nitride is not etched but only the isolation insulation pattern 46 formed of oxide is etched.

As described above, the sidewall of the etch stop pattern 44 is exposed through narrowing the isolation insulation pattern 46 from $P_{11}$ to $P_{12}$ through the secondary etch, thereby ensuring the minimum bottom CD required for the third opening 48A. Also, it is possible to prevent a contact-not-open phenomenon, (caused by a lack of an etching margin during the secondary etch of forming the third opening 48A), from occurring. To be specific, although the isolation insulation layer remains on the bottom of the third opening 48A due to lack of the etching margin during the primary etch of forming the second opening 48, that is, although the contact-not-open phenomenon occurs, the isolation insulation layer remaining on the bottom of the third opening 48A can be removed through the secondary etching process. Accordingly, it is possible to improve the fabricating yield of a semiconductor device.

As the sidewall of the isolation insulation pattern 46 is narrowed from $P_{11}$ to $P_{12}$, the top CD W2 as well as the bottom CD W3 of the third opening 48A can be enlarged. Therefore, process conditions such as an etchant concentration and an etching time should be controlled in consideration of a space between the adjacent third openings 48A during the secondary etch.

The second etch barrier pattern 47 is removed. The second etch barrier pattern 47 may be vanished and removed during the primary etch and the secondary etch. If the second etch barrier pattern 47 remains after the primary and secondary etches, a subsequent process may be performed after removing the remaining second etch barrier pattern 47 through a separate removal process.

Figure 4E:
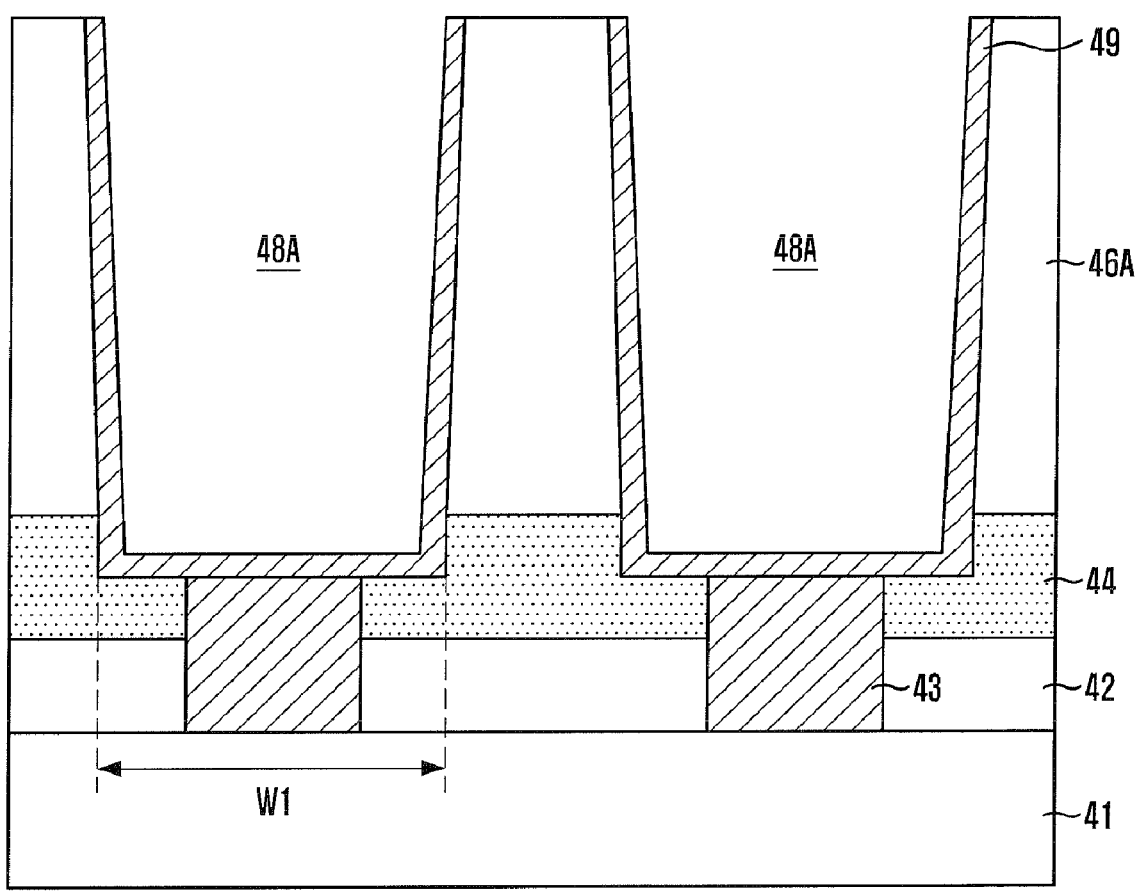

Referring to FIG. 4E, a conductive layer for a storage node is deposited along surfaces of the narrowed isolation insulation pattern 46A and the second pattern 48A. The conductive layer for the storage node may be formed to a thickness ranging from approximately 100 Å to approximately 300 Å using chemical vapor deposition (CVD) or atomic layer deposition (ALD).

The conductive layer for storage node may include one layer selected from the group consisting of a titanium nitride (TiN) layer, a tantalum nitride (TaN) layer, a hafnium nitride (HfN) layer, a ruthenium (Ru) layer, a ruthenium oxide ($RuO_2$) layer, a platinum (Pt) layer, an iridium (Ir) layer, and an iridium oxide ($IrO_2$) layer, or a multilayer thereof.

The conductive layer for storage node is removed so as to expose the top surface of the narrowed isolation insulation pattern 46A. That is, an isolation process is performed to isolate adjacent storage nodes 49 from each other, thereby forming the storage nodes 49. The isolation process of the storage nodes 49 may be performed through CMP or etch-back process. Here, when the storage nodes 49 are isolated through the etchback process, the isolation process may be performed after filling a sacrificial layer a vacancy inside the storage node 49 in order to prevent the bottom surface of the storage node 49 from being damaged.

Figure 4F:
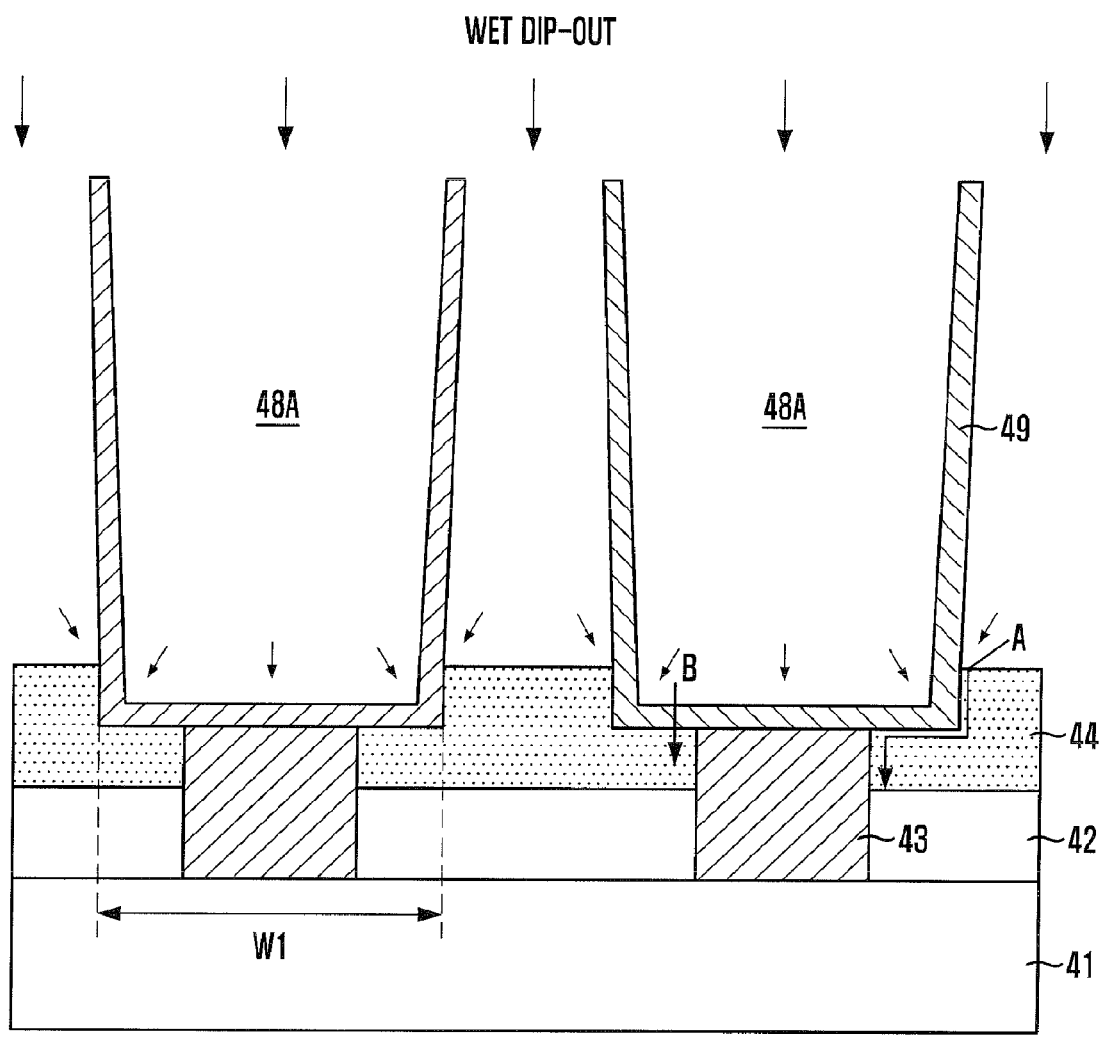

Referring to FIG. 4F, the narrowed isolation insulation pattern 46A is removed through a wet dip-out process to complete fabricating of the storage node 49 in a cylindrical form. An etching chemical used in the wet etching dip-out may use BOE or HF solution.

Since the etch stop pattern 44 having the first opening 44A surrounds an outer wall of a lower portion of the storage node 49, it is possible to prevent the etching chemical from contacting the ILD pattern 42 although the etching chemical penetrates the storage node 49 during the wet dip-out process. This can also prevent a bunker defect from occurring.

More specifically, when an etching chemical penetrates along the outer wall of the storage node 49 through the pathway A and when the etching chemical penetrates through the pathway B, that is, through the bottom surface of the storage node 49 which does not contact the storage node contact plug 43, penetration pathways are increased because the etch stop pattern 44 having the first opening 44A surrounds the outer wall of the lower portion of the storage node 49. This makes it possible to prevent the etching chemical from penetrating up to the ILD pattern 42.

Also, a leaning phenomenon can be prevented because the etch stop pattern 44 surrounding the outer wall of the storage node 49 supports the storage node 49 during the wet dip-out process.

Afterwards, although not shown, a dielectric layer is formed over the storage node 49 using CVD or ALD process. The dielectric layer may include a monolayer selected from the group consisting of a zirconium oxide ($ZrO_2$) layer, a tantalum oxynitride (TaON) layer, a tantalum oxide ($Ta_2O_5$) layer, a titanium oxide ($TiO_2$) layer, an aluminum oxide ($Al_2O_3$) layer, a hafnium oxide ($HfO_2$) layer, a strontium titanium oxide ($SrTiO_3$) layer, and a barium strontium titanium oxide (($Ba,Sr)TiO_3$) layer, or a multilayer thereof.

A method of forming the dielectric layer of $ZrO_2$ using ALD process is described below. The $ZrO_2$ layer may be formed by performing a unit deposition cycle plural times.

[Unit Deposition Cycle]

(Dielectric source/purge/oxygen source/purge)×n times

In the unit deposition cycle, the 'dielectric source' means injecting zirconium (Zr) source; the 'purge' means injecting a purge gas; and the 'oxygen source' means injecting an oxygen source for zirconium oxidation to form a zirconium oxide layer. The unit deposition cycle is repeated in number of times to thereby control a total thickness of the dielectric layer, i.e., zirconium oxide layer.

More specifically, the zirconium source flows into a chamber maintaining a substrate temperature to a range of approximately 200° C. to approximately 350° C. under condition that an internal pressure of the chamber is maintained to a range of approximately 0.1 Torr to approximately 1 Torr. Resultantly, the dielectric source is adsorbed onto the substrate. At this time, the zirconium source can be supplied into the chamber using Ar gas as a carrier gas of the zirconium source. The Ar gas is supplied into the chamber at a flow rate of approximately 20 sccm to approximately 250 sccm for approximately 0.1 second to approximately 10 seconds. Here, the zirconium source may be selected from the group consisting of $Zr[N(CH_3)]_4$, $Zr[N(CH_2CH_3)]_4$, $Zr[N(CH_3)(CH_2CH_3)]_4$ and $Zr[N(CH_3)_2(CH_2CH_3)_2]$.

The purging process is performed by flowing $N_2$ gas to remove unreacted zirconium source. The $N_2$ gas is supplied at a flow rate of approximately 50 sccm to approximately 400 sccm for approximately 3 seconds to approximately 10 seconds.

The oxygen source, $O_3$ gas, flows to induce a reaction between the zirconium source adsorbed on the surface of the storage node 49 and $O_3$ gas, so that the zirconium oxide layer is deposited at a level of an atomic film. At this time, the $O_3$ gas act as an oxidant, and is supplied at a flow rate of approximately 20 sccm to approximately 500 sccm for approximately 3 seconds to approximately 10 seconds.

To remove unreacted $O_3$ gas and by-products, the purging process is performed through supplying $N_2$ gas. The $N_2$ gas is supplied at a flow rate of approximately 50 sccm to approximately 200 sccm for approximately 3 seconds to approximately 10 seconds.

The oxygen source of oxidizing the dielectric source may use $H_2O$ or $O_2$ plasma besides $O_3$. The purge gas may include an inactive gas such as Ar besides $N_2$ gas. The remaining gas or by-products may be discharged to the outside using a vacuum pump.

Through the above-described processes, the zirconium oxide layer may be formed on inner and outer walls of the storage node 49.

A first thermal treatment is performed to enhance electrical properties of the dielectric layer. In some embodiments, the first thermal treatment, which is aimed to remove impurities such as carbon (C) and hydrogen (H) contained in the dielectric layer and defects such as an oxygen vacancy, is performed through plasma annealing technique or UV/O$_3$ thermal treatment.

To be specific, the first thermal treatment is performed using the plasma thermal treatment under conditions that a plasma power in the range of approximately 50 W to approximately 300 W is applied for approximately 30 seconds to approximately 120 seconds in an ambient of O$_2$, O$_3$, N$_2$O and N$_2$/O$_2$ while maintaining an internal temperature of the chamber to a range of approximately 300° C. to approximately 450° C.

Alternatively, the first thermal treatment is performed using the UV/O$_3$ thermal treatment under conditions that ultraviolet (UV) ray with the intensity of approximately 15 mW/cm$^2$ to approximately 30 mW/cm$^2$ is irradiated onto the dielectric layer for approximately 2 minutes to approximately 10 minutes while maintaining an internal temperature of the chamber to a range of approximately 300° C. to approximately 400° C.

To increase a dielectric constant of the dielectric layer, a second thermal treatment is performed. The second thermal treatment may be performed using a rapid thermal annealing (RTA) or furnace annealing. The dielectric constant of the dielectric layer can be increased by increasing a crystallinity of the dielectric layer, e.g., the zirconium oxide layer by performing the thermal treatment at a temperature ranging from approximately 500° C. to approximately 750° C.

When using RTA, the secondary thermal treatment may be performed at a temperature ranging from approximately 550° C. to approximately 750° C. for approximately 30 seconds to approximately 120 seconds. When using furnace annealing, the secondary thermal treatment may be performed at a temperature ranging from approximately 500° C. to approximately 650° C. for approximately 10 minutes to approximately 30 minutes.

A plate electrode (not shown) is formed on the dielectric layer. The plate electrode may include one layer selected from the group consisting of a titanium nitride (TiN) layer, a tantalum nitride (TaN) layer, a hafnium nitride (HfN) layer, a ruthenium (Ru) layer, a ruthenium oxide (RuO$_2$) layer, a platinum (Pt) layer, an iridium (Ir) layer, and an iridium oxide (IrO$_2$) layer, or a multilayer thereof.

Through the above-described processes, the capacitor of the semiconductor device in accordance with the third embodiment can be completed.

The minimum bottom CD required for the third opening 48A can attained by forming the etch stop pattern 44 having the first opening 44A that defines the minimum bottom CD required for the third opening 48A. This makes it possible to ensure a preset capacitance of the capacitor, and prevent a leaning phenomenon of the storage node 49 during a wet dip-out process.

In addition, the etch stop pattern 44 surrounds the storage node contact plug 43 and the outer wall of the lower portion of the storage node 49, and thus a bunker defect caused by the damage of the ILD pattern 42 can be prevented during the wet dip-out process. Thus, it is possible to prevent problems resulting from the bunker defect, including for example, an electrical short between the storage node 49 and a metal interconnection to be formed over the capacitor, a pattern failure during a mask process of forming a metal interconnection, and a dual bit failure due to a bridge phenomenon between the adjacent storage nodes 49. Further, the leaning phenomenon of the storage node 49 can be effectively prevented during the wet dip-out process.

In summary, the minimum bottom CD required for the third opening 48A, i.e., the open region is ensured, thus improving the reliability and fabrication yield of the capacitor.

Herebelow, a fourth embodiment provides a method for fabricating a semiconductor device including a capacitor having a larger capacitance than the preset capacitance of a capacitor, by increasing an internal area of the open region achieved in the third embodiment. Also, the fourth embodiment provides a method for easily fabricating a semiconductor device that can ensure a space between adjacent storage nodes. For convenience in description, similarities to the third embodiment will be omitted.

FIGS. 5A to 5E illustrate a method for fabricating a semiconductor device in accordance with the fourth embodiment.

Figure 5A:
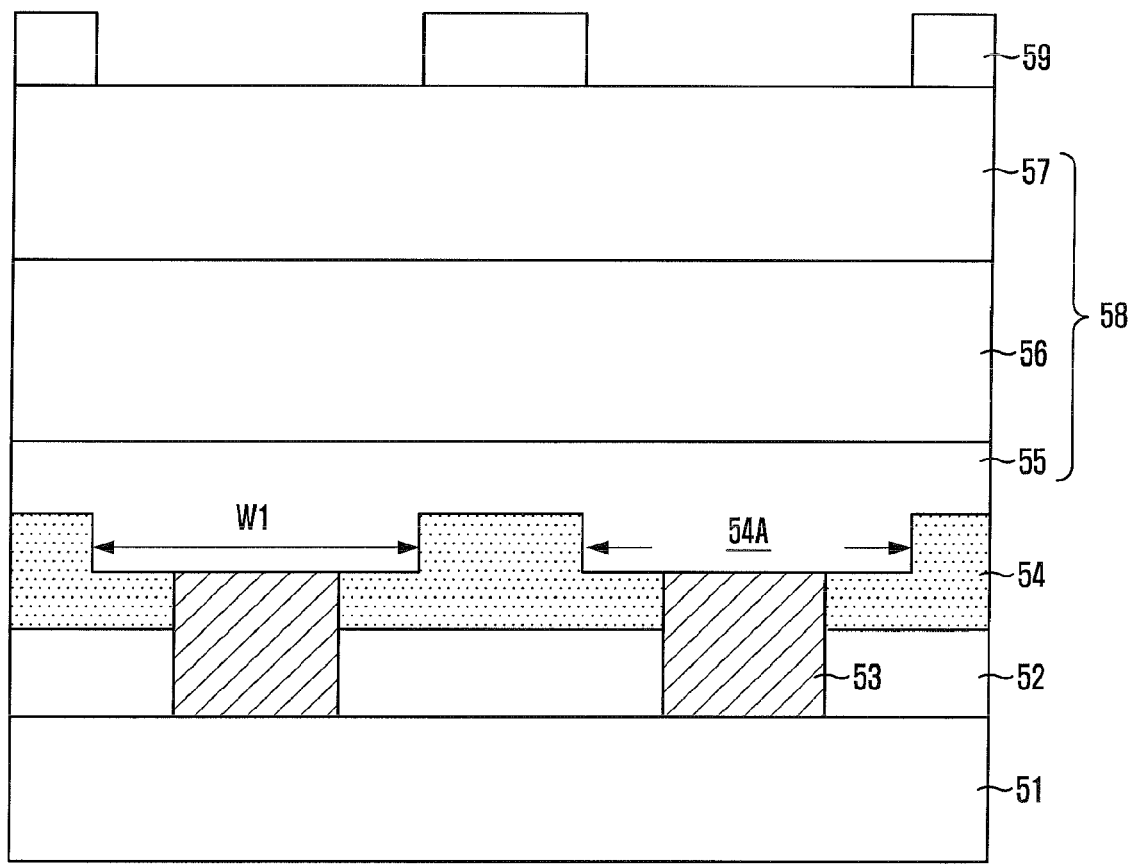
FIGS. 5A to 5E illustrate a method for fabricating a semiconductor device according to a fourth embodiment.

Referring to FIG. 5A, an ILD pattern 52 and a storage node contact plug 53 are formed on a substrate 51, and an etch stop pattern 54 having a first opening 54A exposing a top surface of the storage node contact plug 53 is formed over the ILD pattern 52. The first opening 54A may have a critical dimension W1 allowing an open region (i.e., storage node hole) to have the required minimum bottom CD. That is, the critical dimension W1 of the first opening 54A is equal to the minimum bottom CD required for the open region.

The aforesaid processes may be performed in a similar manner to those described with reference to FIGS. 3A and 3B. Therefore, the storage node contact plug 53, the ILD pattern 52, and the first opening 54A are identical to those of the third embodiment.

An isolation insulation layer 58 is formed over the etch stop pattern 54 having the first opening 54A. The isolation insulation layer 58, which provides a three dimensional structure where a storage node will be formed through a subsequent process, may be formed to a thickness ranging from approximately 10,000 Å to approximately 30,000 Å.

Isolation insulation layer 58 may include an oxide layer. The oxide layer may include one of a silicon oxide (SiO$_2$) layer, a boron phosphorous silicate glass (BPSG), a phosphorous silicate glass (PSG), a tetraethylorthosilicate (TEOS), an undoped silicate glass (USG), a spin-on-glass (SOG), a high-density plasma (HDP) oxide layer, and a spin-on-dielectric (SOD) layer.

To ensure the minimum bottom CD required for an open region to be formed later, prevent the preset top CD of the open region from being increased, and increase an area inside the open region, the isolation insulation layer 58 may have a multilayered structure including oxide layers with different wet etching rates. In some embodiments, the isolation insulation layer 58 has a multilayered structure in which the wet etching rates of the oxide layers gradually decrease from the lowermost oxide layer to the uppermost oxide layer.

For example, the isolation insulation layer 58 may have a multilayered structure including a first oxide layer 55, a second oxide layer 56 on the first oxide layer 55, and a third oxide layer 57 on the second oxide layer 56. The first oxide layer 55 fills the first opening 54A and also covers the top surface of the etch stop pattern 54. The second oxide layer 56 is formed of a material of which an etching rate is slower than that of the first oxide layer 55. The first and second oxide layers 55 and 56 may include a doped oxide layer containing an impurity. Herein, the impurity may contain phosphor (P). Therefore, the first and second oxide layers 55 and 56 may be formed of BPSG or PSG. The third oxide layer 57 may include an undoped oxide layer that does not contain an impurity. Accordingly, the third oxide layer 57 may be formed of plasma-enhanced tetraethylorthosilicate (PETEOS). For reference, it is known that PSG or BPSG has a wet etching rate faster than PETEOS.

To more effectively ensure the minimum bottom CD required for the open region, prevent the top CD of the open region from being increased during a subsequent process, and increase an area of the open region, it is preferable to increase a difference between wet etching rates of the first to third oxide layers 55, 56 and 57. To be specific, the third oxide layer 57 formed of PETEOS, which does not contain an impurity, has the slowest wet etching rate in comparison with the first and second oxide layers 55 and 56 containing an impurity. The first and second oxide layers 55 and 56 containing an impurity may vary their wet etching rates depending on a weight ratio (wt. %) of the impurity. Typically, it is known that the wet etching rate increases as the weight ratio or content ratio of the impurity in the oxide layer increases. Therefore, the weight ratio of the impurity in the first oxide layer 55 may be controlled to be in the range of approximately 6 wt. % to approximately 10 wt. % with respect to a total weight of the first oxide layer 55. In order that the wet etching rate of the second oxide layer 56 may be lower than that of the first oxide layer 55 but higher than that of the third oxide layer 57, the weight ratio of the impurity in the second oxide layer 56 may be controlled to be in the range of approximately 1 wt. % to approximately 10 wt. % with respect to a total weight of the second oxide layer 56. When the weight ratio of the impurity in the oxide layer containing phosphor (P) is less than approximately 1 wt. %, the third oxide layer cannot have a wet etching rate that is faster than that of PETEOS. When the weight ratio of the impurity in the oxide layer is more than approximately 10 wt. %, the oxide layer has poor properties so that it cannot serve as an insulator.

To much more effectively ensure the minimum bottom CD required for the open region, the lowermost oxide layer, i.e., the first oxide layer 55 of the isolation insulation layer 58 may have a thickness ranging from approximately 500 Å to approximately 1,000 Å.

A second etch barrier pattern 59 is formed on the third oxide layer 57 of the isolation insulation layer 58. The second etch barrier pattern 59 may be identical to the first etch barrier pattern used to form the first opening 54A between the etch stop patterns 54. That is, the second etch barrier pattern 59 may be formed using the same photomask as the first etch barrier pattern. Therefore, an opening of the first etch barrier pattern is equal in width to an opening of the second etch barrier pattern 59 (see FIGS. 3A to 3C).

The second etch barrier pattern 59, which serves as an etch barrier when the isolation insulation layer is etched to form an open region, may be formed of oxide, nitride, oxynitride, amorphous carbon, or a multilayer thereof.

Figure 5B:
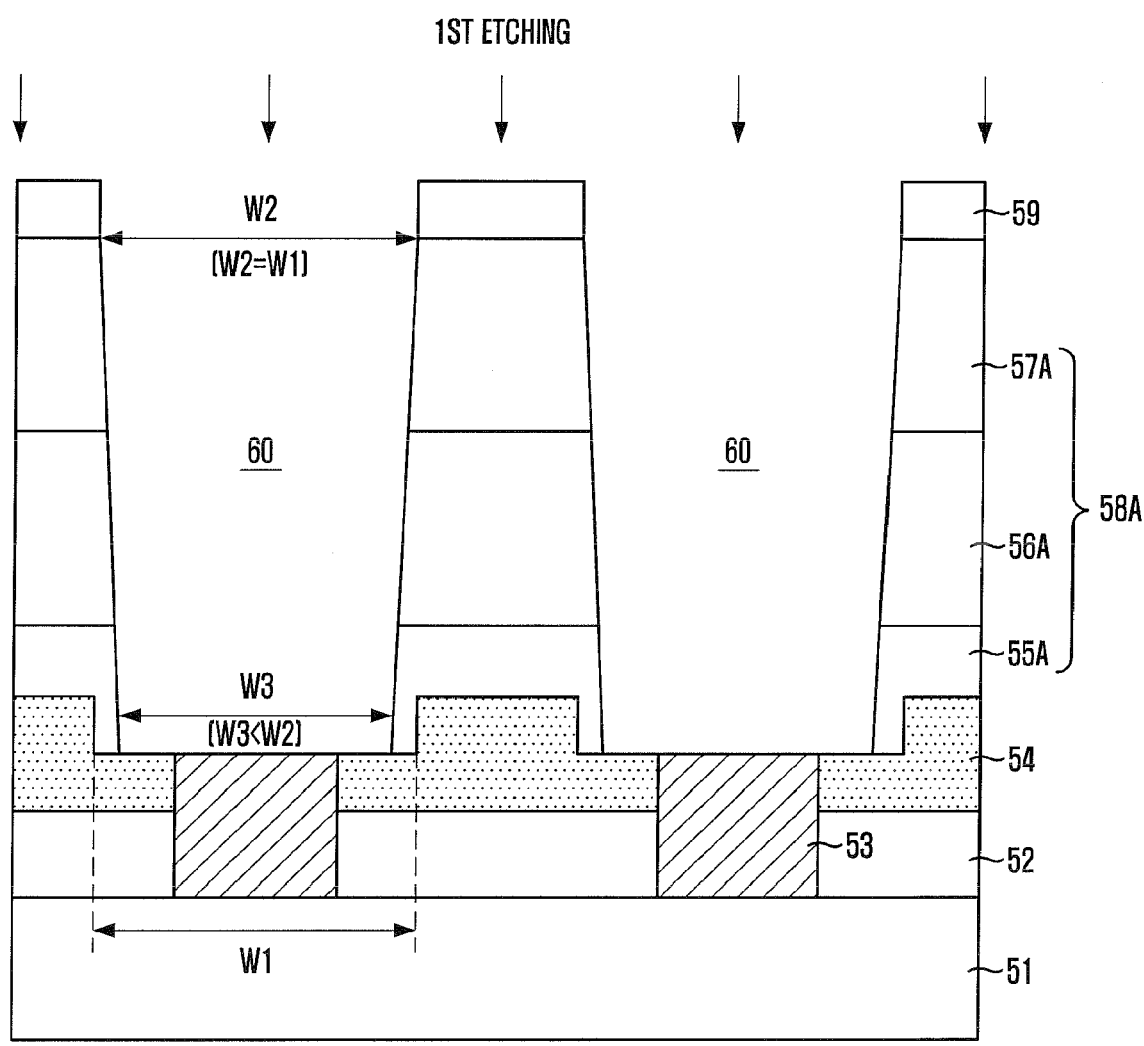

Referring to FIG. 5B, the isolation insulation layer 58 is etched using the second etch barrier pattern 59 as an etch barrier. That is, the third oxide layer 57, the second oxide layer 56, and the first oxide layer 55 are sequentially etched to expose the top surface of the storage node contact plug 53, and to form an isolation insulation pattern 58A and a second opening 60 having a top CD W2 equal to the critical dimension W1 of the first opening 54A. The isolation insulation pattern 58A includes a first oxide pattern 55A, a second oxide pattern 56A on the first oxide pattern, and a third oxide pattern 57A on the second oxide pattern 56A. The second opening 60 is typically called an open region. Hereinafter, the etching process of forming the second opening 60 is abbreviated to 'primary etch'. The primary etch may be performed using a dry etching process, for example, plasma etching process.

A pressure inside the second opening 60 increases due to an etching gas and etch by-products produced during the etching of the isolation insulation layer 58. This may cause the etching efficiency to be poorer as the second opening 60 is etched deeper. Accordingly, the bottom CD W3 of the second opening 60 may be smaller than the top CD W3 (W2>W3).

The top CD W2 of the second opening 60 is equal to the critical dimension W1 of the first opening 54A because the first etch barrier pattern and the second etch barrier pattern 59 are formed using the same photomask (W1=W2). Due to etching characteristics during the primary etch, the bottom CD W3 of the second opening 60 is smaller than the minimum bottom CD of the second opening 60, i.e., the critical dimension W1 of the first opening 54A (W1>W3).

Although the isolation insulation layer 58 may have a multilayered structure including the first oxide layer 55, the second oxide layer 56, and the third oxide layer 57, the first to third oxide layers 55, 56 and 57 are etched at the same etching rate during the dry etching process.

In summary, since the second etch barrier pattern 59 having the same opening as the first etch barrier pattern is used as an etch barrier during the primary etch and the bottom CD W3 of the second opening 60 is smaller than the top CD W2, the sidewall of the etch stop pattern 54 is not exposed although the second opening 60 is formed through the primary etch. That is, it is impossible to ensure the minimum bottom CD required for the second opening 60 only through the primary etch.

Figure 5C:
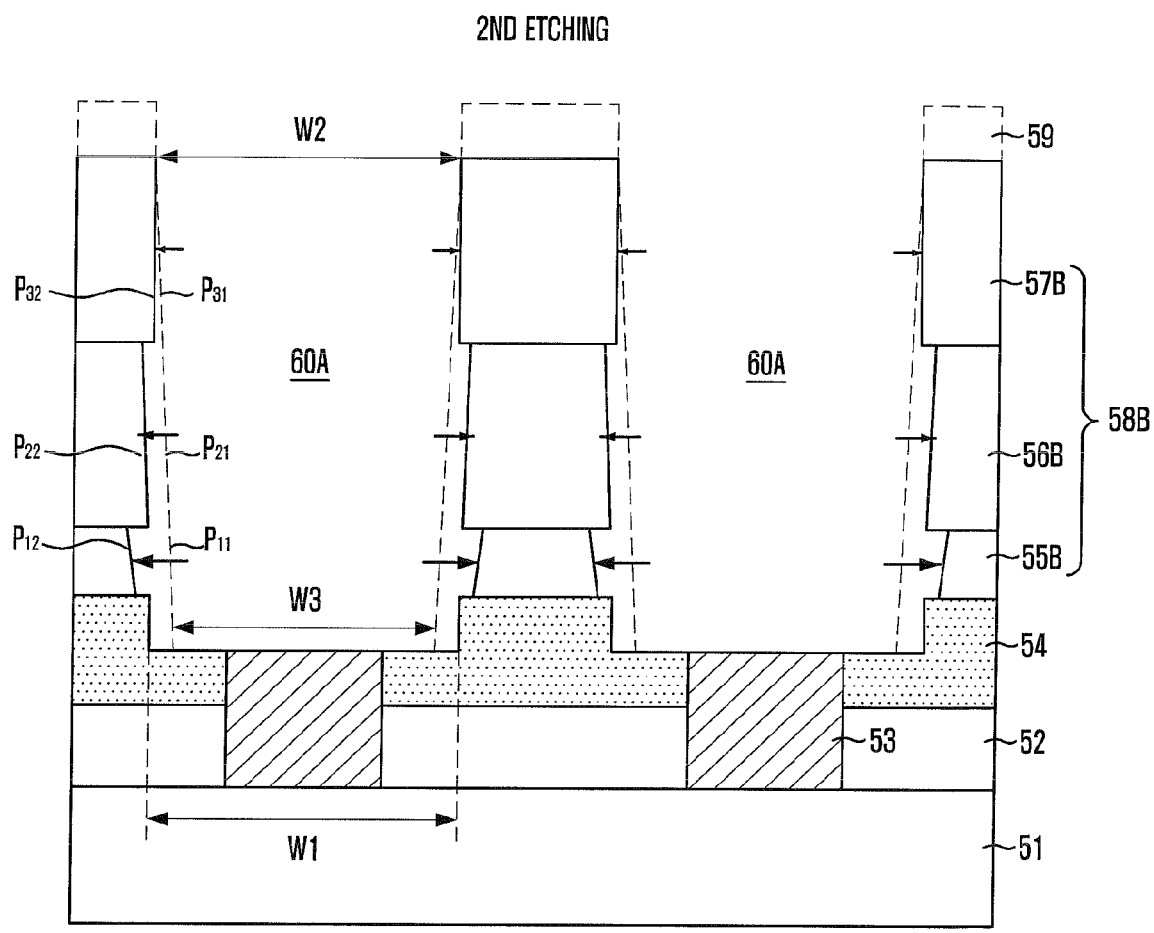

Therefore, as illustrated in FIG. 5C, to ensure the minimum bottom CD required for the second opening 60, the sidewall of the isolation insulation pattern 58A is additionally etched to expose the sidewall of the etch stop pattern 54. At the same time, a third opening 60A is formed, which is larger than the second opening 60. Hereinafter, the etching process of exposing the sidewall of the etch stop pattern 54 will be abbreviated to 'secondary etch'. Here, reference numeral 58B denotes a narrowed isolation insulation pattern, and reference numerals 55B, 56B and 57B denote narrowed first, second and third oxide patterns, respectively.

Meanwhile, a portion of the top surface of the etch stop pattern 54 as well as the sidewall of the etch stop pattern 54 may be exposed during the secondary etch.

The secondary etch may be performed using a wet etching. For instance, in case where the isolation insulation layer 58 is formed of oxide, the secondary etch of exposing the sidewall of the etch stop pattern 54 may be performed using a buffered oxide etchant (BOE) or a hydrofluoric acid (HF) solution. By controlling process conditions such as an etchant concentration and an etching time, it is possible to control an exposed area of the sidewall of the etch stop pattern 54, an exposed area of the top surface of the etch stop pattern 54, and a space between adjacent third openings 60A.

An etching chemical used in the secondary etch, that is, the BOE or HF solution, is an etchant for etching oxides, so that the etch stop pattern 54 formed of nitride is not etched, but only the isolation insulation pattern 58A formed of oxide is etched.

More specifically, the third oxide pattern 57A may be somewhat narrowed from $P_{31}$ to $P_{32}$ during the secondary etch. However, the third oxide pattern 57A is etched little because the third oxide pattern 57A has the lowest wet etching rate in comparison with the first and second oxide patterns 55A and 56A. Accordingly, it is possible to prevent the preset top CD W2 of the third opening 60A from being increased during the secondary etch, and also to ensure a space between the adjacent third openings 60A.

The second oxide pattern 56A may be narrowed from P21 to P22, so that the third opening defined by the narrowed second oxide pattern 56B is enlarged during the secondary etch. Since the second oxide pattern 56A has the wet etching rate higher than the third oxide pattern 57A, the second oxide pattern 56A is etched more than the third oxide pattern 57A. As a result, the third opening 60A may have an internal area larger than an internal area of the second opening 60, which makes it possible to increase the capacitance of the capacitor.

Furthermore, the first oxide pattern 55A is narrowed from P11 to P12 during the secondary etch to expose the sidewall of the etch stop pattern 54, thus ensuring the minimum bottom CD required for the second opening 60. At this time, the first oxide pattern 55A is etched more than the second oxide pattern 56A during the secondary etch because the first oxide pattern is superior in wet etching rate to the secondary oxide pattern 56A. Accordingly, it is possible to ensure the minimum bottom CD required for the third opening 60A, and simultaneously to form the third opening 60A greater than the second opening 60. Consequently, the capacitance of the capacitor can be much more increased.

A contact-not-open phenomenon, caused by lack of an etching margin during an etching process of forming the third opening 60A during the secondary etch, can be prevented. Specifically, although the isolation insulation pattern 58A remains on the bottom of the third opening 60A due to lack of the etching margin during the primary etch of forming the second opening 60, (that is, although the contact-not-open phenomenon occurs), the isolation insulation layer 58 remaining on the bottom of the second opening 60 can be removed through the secondary etching process. Accordingly, it is possible to prevent the contact-not-open phenomenon from occurring, which can improve the fabricating yield of a semiconductor device.

In summary, it is possible to ensure the minimum bottom CD required for the third opening 60A through the secondary etch, and simultaneously increase an internal area of the third opening 60A.

The second etch barrier pattern 59 is removed. The etch barrier pattern 59 may be all vanished and removed during the primary etch and the secondary etch. If the second etch barrier pattern 59 remains even after the completion of the primary and secondary etching processes, the remaining second etch barrier pattern 59 may be removed through a separate removal process.

Figure 5D:
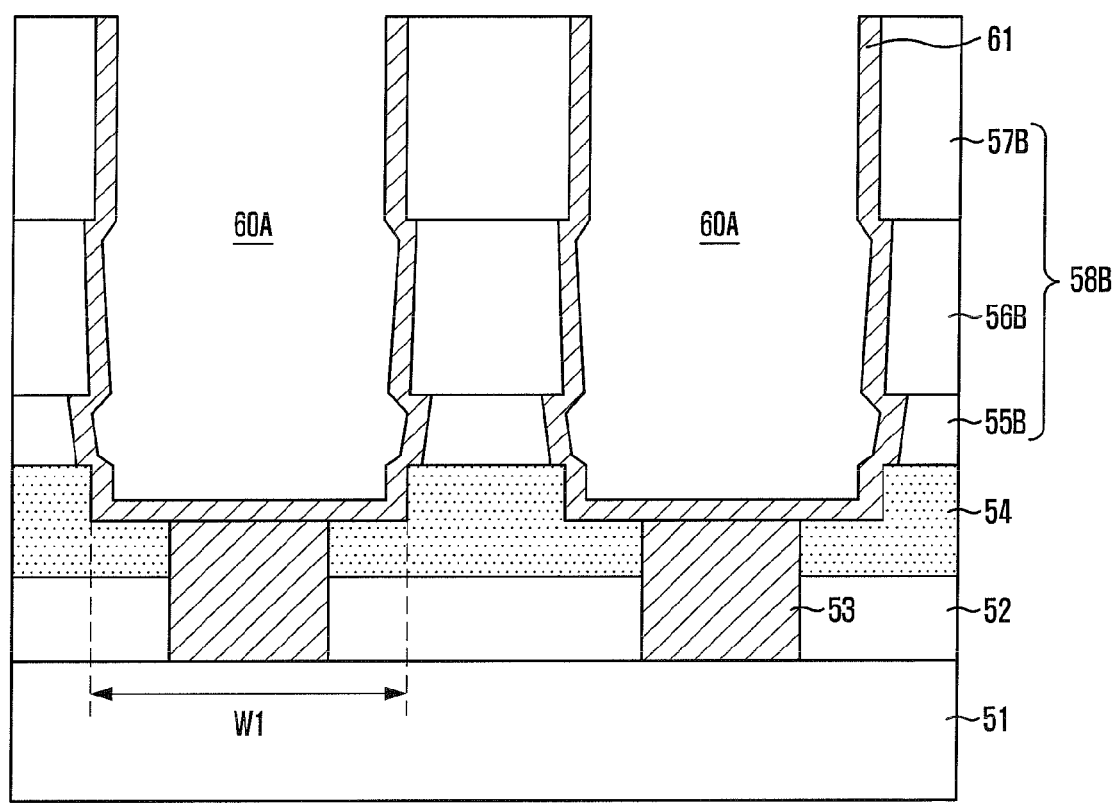

Referring to FIG. 5D, a conductive layer for a storage node is deposited over a resultant structure including the narrowed isolation insulation pattern 58B and the third opening 60A. The conductive layer for a storage node may be formed to a thickness ranging from approximately 100 Å to approximately 300 Å using CVD or ALD.

The conductive layer for a storage node may include one layer selected from the group consisting of a titanium nitride (TiN) layer, a tantalum nitride (TaN) layer, a hafnium nitride (HfN) layer, a ruthenium (Ru) layer, a ruthenium oxide ($RuO_2$) layer, a platinum (Pt) layer, an iridium (Ir) layer, and an iridium oxide ($IrO_2$) layer, or a multilayer thereof.

The conductive layer for storage node is removed so as to expose the top surface of the narrowed isolation insulation pattern 58B. That is, an isolation process is performed to isolate adjacent storage nodes 61 from each other, thereby forming the storage nodes 61. The isolation process of the storage nodes 61 may be performed through CMP or etchback process. Here, when the storage nodes 61 are isolated through the etchback process, the isolation process may be performed after filling a sacrificial layer a space inside the storage node 61 in order to prevent the bottom surface of the storage node 61 from being damaged.

Figure 5E:
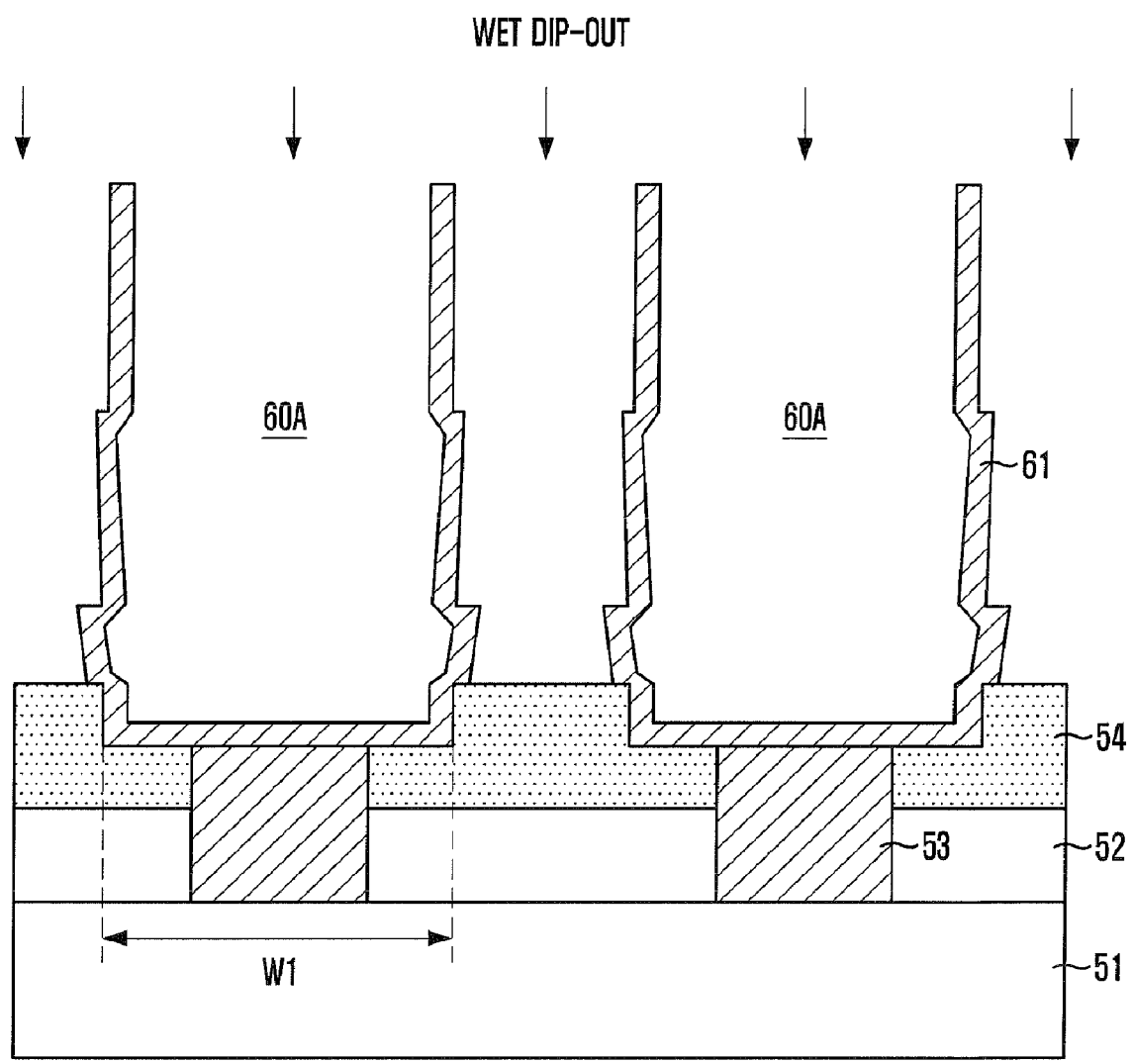

Referring to FIG. 5E, the narrowed isolation insulation pattern 58B is removed through a wet dip-out process to achieve the storage node 61 in a cylindrical form. An etching chemical used in the wet etching dip-out may use BOE or HF solution.

Since the etch stop pattern 54 having the first opening 54A surrounds an outer wall of a lower portion of the storage node 61, it is possible to prevent the etching chemical from contacting the ILD pattern 52 although the etching chemical penetrates the storage node 61 during the wet dip-out process. This can also prevent a bunker defect from occurring (see FIG. 3F).

Also, a leaning phenomenon can be prevented because the etch stop pattern 54 surrounding the outer wall of the storage node 61 supports the storage node 61 during the wet dip-out process.

Although not shown, a dielectric layer is formed over the storage node 61 using CVD or ALD process. The dielectric layer may include a monolayer selected from the group consisting of a zirconium oxide ($ZrO_2$) layer, a tantalum oxynitride (TaON) layer, a tantalum oxide ($Ta_2O_5$) layer, a titanium oxide ($TiO_2$) layer, an aluminum oxide ($Al_2O_3$) layer, a hafnium oxide ($HfO_2$) layer, a strontium titanium oxide ($SrTiO_3$) layer, and a barium strontium titanium oxide ($(Ba,Sr)TiO_3$) layer, or a multilayer thereof. A method of forming the dielectric layer has been fully described in the third embodiment.

A plate electrode (not shown) is formed on the dielectric layer. The plate electrode may include one layer selected from the group consisting of a titanium nitride (TiN) layer, a tantalum nitride (TaN) layer, a hafnium nitride (HfN) layer, a ruthenium (Ru) layer, a ruthenium oxide ($RuO_2$) layer, a platinum (Pt) layer, an iridium (Ir) layer, and an iridium oxide ($IrO_2$) layer, or a multilayer thereof.

Through the above-described processes, the capacitor of the semiconductor device in accordance with the fourth embodiment can be completed.

The minimum bottom CD required for the third opening 60A can be ensured by forming the etch stop pattern 54 having the first opening 54A that defines the minimum bottom CD required for the third opening 60A. This makes it possible to ensure a preset capacitance of the capacitor, and prevent a leaning phenomenon of the storage node 61 during a wet dip-out process.

Also, the isolation insulation layer 58 has a multilayered structure including oxide layers with different wet etching rates, thus making it possible to ensure the bottom CD required for the third opening 60A and prevent the top CD of the third opening 60A from being increased as well. Further, the third opening 60A can have a larger internal area than an internal area of the second opening 60. Thus, the capacitance can have a higher capacitance than the preset capacitance.

In addition, the etch stop pattern 54 having the first opening 54A surrounds the storage node contact plug 53 and the outer wall of the lower portion of the storage node 61, and thus a bunker defect caused by the damage of the ILD pattern 52 can be prevented during the wet dip-out process. Thus, it is possible to prevent problems resulting from the bunker defect, for example, an electrical short between the storage node 61 and a metal interconnection to be formed over the capacitor, a pattern failure during a mask process of forming a metal interconnection, and a dual bit fail due to a bridge phenomenon between the adjacent storage nodes 61. Further, the leaning phenomenon of the storage node 61 can be effectively prevented during the wet dip-out process.

In accordance with the disclosed embodiments, it is possible to ensure a minimum bottom CD required for a semiconductor device by forming an etch stop pattern having a first opening.

In addition, a method for fabricating a semiconductor device in accordance with the disclosed embodiments can prevent a contact-not-open phenomenon from occurring in an open region.

Application of a method for fabricating a semiconductor device to a process of forming a contact plug such as a metal contact plug ensures a minimum contact area between the contact plug and a contact plug disposed thereunder, thus preventing a contact resistance therebetween from being increased.

Furthermore, the application of a method for fabricating a semiconductor device to a process of forming a capacitor can prevent leaning and bridge phenomena of a storage node, and can also provide a capacitor having a higher capacitance than a preset capacitance.

Consequently, a method for fabricating a semiconductor device can improve characteristics of a semiconductor device, and also improve fabrication yield.

While various embodiments been described, it will be apparent to those skilled in the art that various changes and modifications may be made.

What is claimed is:

1. A method for fabricating a semiconductor device, the method comprising:
    forming an etch stop layer over a conductive layer;
    selectively etching the etch stop layer to form an etch stop pattern, the etch stop pattern having a first opening that exposes a top surface of the conductive layer;
    forming an insulation layer over the etch stop pattern to fill the first opening, and to cover a top surface of the etch stop pattern;
    selectively etching the insulation layer to form a second opening, the second opening exposing a portion of the top surface of the conductive layer and sidewalls of the insulation layer, wherein the etch stop pattern has sidewalls that remain covered by the insulation layer; and
    enlarging the second opening until the sidewalls of the etch stop pattern are exposed.

2. The method of claim 1, wherein a top dimension of the second opening is equal to a dimension of the first opening.

3. The method of claim 1, wherein the insulation layer has a monolayered structure including one oxide layer.

4. The method of claim 1, wherein the insulation layer has a multilayered structure including oxide layers with different wet etching rates.

5. The method of claim 1, wherein the insulation layer has a multilayered structure including oxide layers with different wet etching rates, and the wet etching rates of the oxide layers gradually decrease from a lowermost oxide layer to an uppermost oxide layer.

6. The method of claim 1, wherein forming the insulation layer comprises:
    forming a first oxide layer to cover the etch stop pattern having the first opening;
    forming a second oxide layer over the first oxide layer, the second oxide layer having a wet etching rate lower than the first oxide layer; and
    forming a third oxide layer over the second oxide layer, the third oxide layer having a wet etching rate lower than the second oxide layer.

7. The method of claim 6, wherein each of the first and second oxide layers includes a doped oxide layer having an impurity.

8. The method of claim 7, wherein the impurity includes phosphorus (P).

9. The method of claim 7, wherein each of the first and second oxide layers includes phosphorous silicate glass (PSG) or boron phosphorous silicate glass (BPSG).

10. The method of claim 6, wherein a weight ratio (wt. %) of an impurity contained in the first oxide layer is larger than that of an impurity contained in the second oxide layer.

11. he method of claim 6, wherein an impurity contained in the first oxide layer has a weight ratio of approximately 6 wt. % to approximately 10 wt. % with respect to a total weight of the first oxide layer, and an impurity contained in the second oxide layer has a weight ratio of approximately 1 wt. % to approximately 5 wt. % with respect to a total weight of the second oxide layer.

12. The method of claim 6, wherein the third oxide layer includes an impurity-free undoped oxide layer.

13. The method of claim 6, wherein the third oxide layer includes plasma-enhanced tetraethylorthosilicate (PE-TEOS).

14. The method of claim 1, wherein the etch stop pattern includes a nitride layer.

15. The method of claim 1, wherein the first and second openings are formed through a same photomask.

16. The method of claim 1, wherein forming the second opening is performed through a dry etching process.

17. The method of claim 1, wherein enlarging the second opening is performed using a wet etching process.

18. The method of claim 1, wherein enlarging the second opening is performed using a buffered oxide etchant (BOE) or a hydrofluoric (HF) acid solution.

19. The method of claim 1, wherein the second opening includes a storage node hole used to form a storage node, or a contact hole used to form a contact plug.

20. A method for fabricating a capacitor of a semiconductor device, the method comprising:
    forming an etch stop pattern over a substrate including a storage node contact plug, the etch stop pattern having a first opening that exposes a top surface of the storage node contact plug, said etch stop pattern having a first portion and a second portion on the first portion;
    forming an insulation layer over the etch stop pattern to cover the top surface of the storage node contact plug, a top surface of the first portion of the etch stop pattern, and a top surface and sidewalls of the second portion of the etch stop pattern;
    selectively etching the insulation layer to form a second opening, the second opening exposing the top surface of the storage node contact plug, and exposing a portion of the top surface of the first portion of the etch stop pattern, wherein the sidewalls and the top surface of the second portion of the etch stop pattern remain covered by the insulating layer;
    enlarging the second opening until said sidewalls of the second portion of the etch stop pattern are exposed;
    forming a storage node along a surface profile of the second opening; and
    removing the insulation layer.

21. The method of claim 20, wherein a top dimension of the second opening is equal to a dimension of the first opening.

22. The method of claim 20, wherein said forming the etch stop pattern comprises:
    forming an interlayer dielectric (ILD) layer having a storage node contact plug over the substrate;

recessing the ILD layer to form an ILD pattern and to protrude a portion of the storage node contact plug upward above the ILD pattern;

forming an etch stop layer to cover a top surface of the storage node contact plug protruding above the ILD pattern, and etch stop layer having a stepped portion over the top surface of the storage node contact plug; and selectively etching the etch stop layer to form an etch stop pattern, the etch stop pattern having the first opening that exposes the top surface of the storage node contact plug, a top surface of the first portion of the etch stop pattern, and the sidewalls of the second portion of the etch stop pattern, wherein said top surface of the first portion of the etch stop pattern has a same height as the top surface of the storage node contact plug, and the sidewalls of the second portion of the etch stop pattern are higher than the top surface of the storage node contact plug.

* * * * *